(12) United States Patent
Mishima

(10) Patent No.: US 6,335,784 B2
(45) Date of Patent: Jan. 1, 2002

(54) SCAN TYPE PROJECTION EXPOSURE APPARATUS AND DEVICE MANUFACTURING METHOD USING THE SAME

(75) Inventor: Kazuhiko Mishima, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/782,141

(22) Filed: Jan. 9, 1997

(30) Foreign Application Priority Data

| Jan. 16, 1996 | (JP) | 8-021625 |
| Dec. 11, 1996 | (JP) | 8-352242 |

(51) Int. Cl.⁷ .................. G03B 27/42; G03B 27/52; G03C 5/00
(52) U.S. Cl. .................. 355/53; 355/55; 430/30
(58) Field of Search .................. 355/53, 67, 71, 355/55; 430/30, 394; 356/399, 400, 401; 364/468.29

(56) References Cited

U.S. PATENT DOCUMENTS

| 5,416,562 A | * | 5/1995 | Ota et al. ............ 355/53 |
| 5,448,333 A | | 9/1995 | Iwamoto et al. .......... 355/53 |
| 5,640,227 A | | 6/1997 | Kato et al. ............ 355/53 |
| 5,721,608 A | * | 2/1998 | Taniguchi .............. 355/53 |
| 5,747,202 A | * | 5/1998 | Tanaka ................ 355/53 |
| 5,805,273 A | * | 9/1998 | Unno .................. 355/53 |
| 5,828,573 A | * | 10/1998 | Hayashi ............. 364/468.28 |
| 6,118,515 A | * | 9/2000 | Wakamoto et al. ....... 355/53 |

FOREIGN PATENT DOCUMENTS

| JP | 7-221012 | 8/1995 |
| JP | 7-272999 | 10/1995 |

* cited by examiner

*Primary Examiner*—Russell Adams
*Assistant Examiner*—Peter B. Kim
(74) *Attorney, Agent, or Firm*—Fitzpatrick, Cella, Harper & Scinto

(57) ABSTRACT

A scan type exposure apparatus includes a first movable stage on which a first object is to be placed, a second movable stage on which a second object is to be placed, a projection optical system for projecting a pattern of the first object onto the second object, and a scanning mechanism for scanningly moving the first and second movable stages in a timed relation with each other, relative to the projection optical system, while the pattern of the first object is projected by the projection optical system onto the second object, wherein data, corresponding to a change in exposure condition as measured beforehand and to be produced by moving at least one of the first and second movable stages, is stored and wherein scan exposure is performed while reflecting a correction value, as determined on the basis of the data stored, to the drive of at least one of the first and second movable stages.

23 Claims, 22 Drawing Sheets

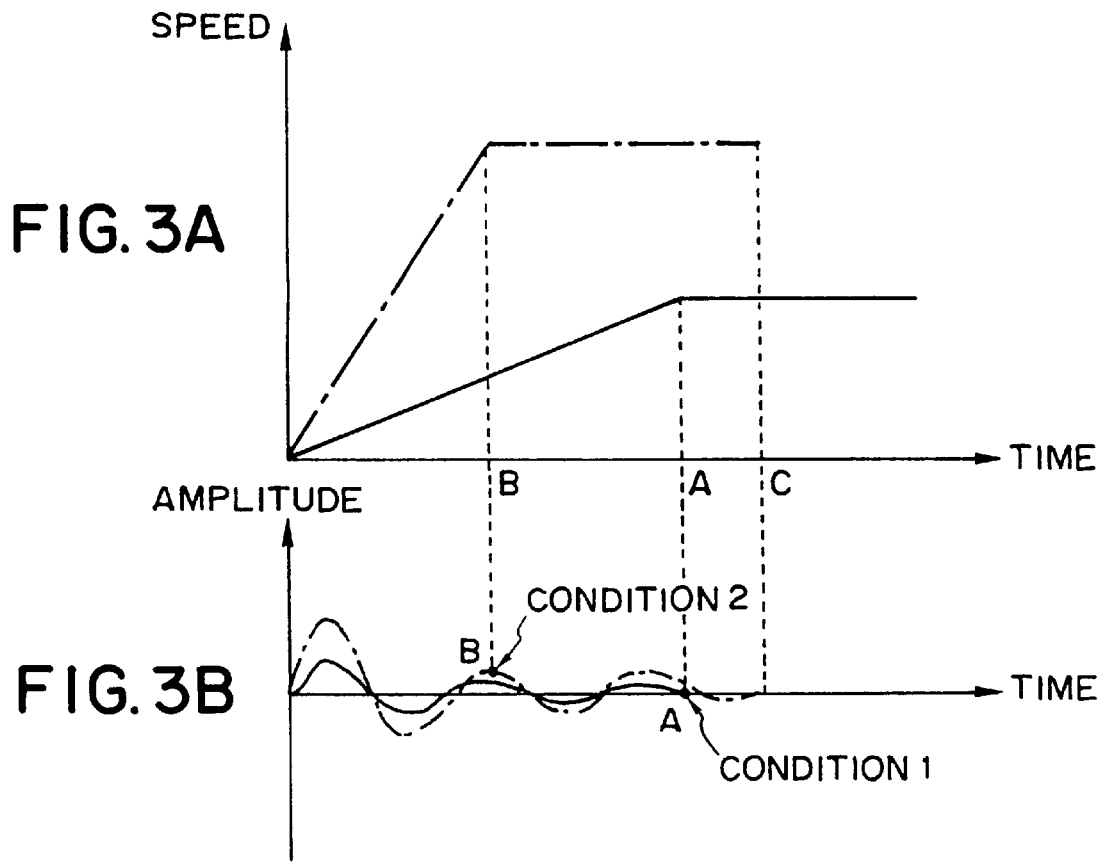
FIG. 3A
FIG. 3B
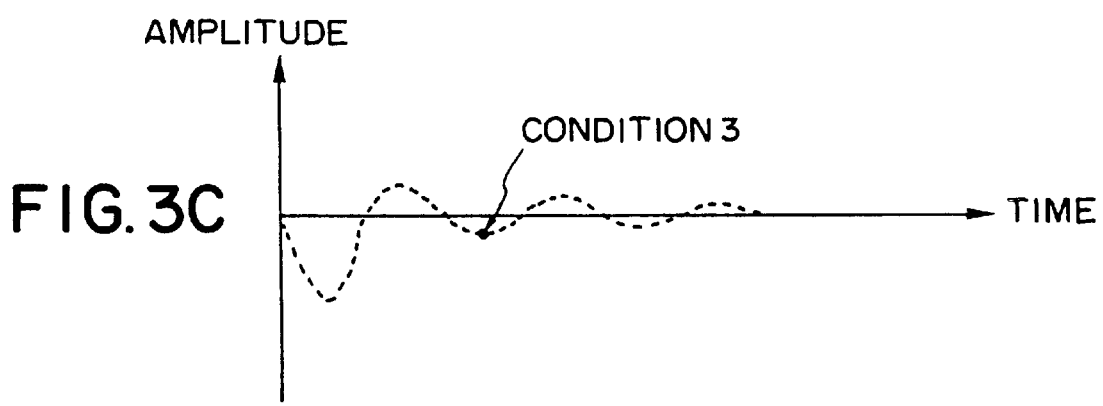
FIG. 3C

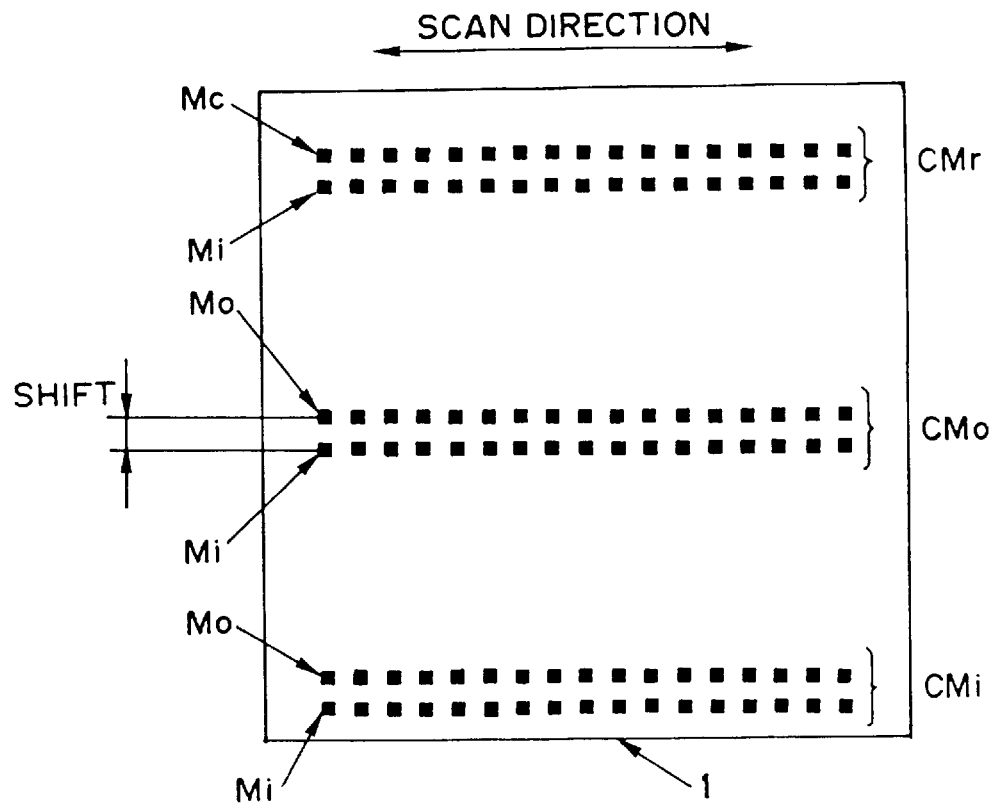
FIG. 5
FIG.6A  Mo
FIG.6B  Mi
FIG.6C  CM (NO OFFSET)
FIG.6D  CM (WITH OFFSET)

SCAN TYPE PROJECTION EXPOSURE APPARATUS AND DEVICE MANUFACTURING METHOD USING THE SAME

FIELD OF THE INVENTION AND RELATED ART

This invention relates to an exposure apparatus for use in the manufacture of semiconductor devices and, more particularly, to a projection exposure apparatus and method for transferring, by projection, a photomask pattern onto a wafer. Also, the invention relates to a semiconductor device manufacturing method. More specifically, the present invention is concerned with a scan type exposure apparatus and method, or to a semiconductor device manufacturing method using the same, wherein, for projection exposure of a wafer to a photomask pattern, the mask and a wafer are scanningly moved in synchronism relative to a projection optical system (projection exposure system). As an example, the invention is suitably applicable to a scan type projection exposure apparatus which is usable in a lithographic process, among device manufacturing processes for the manufacture of semiconductor devices such as ICs or LSIs, image pickup devices such as CCDs, display devices such as liquid crystal panels, or magnetic heads, for example, to perform wafer alignment when a pattern of a reticle (first object) is to be projected by a projection optical system onto the surface of a wafer (second object).

The density of integration of a semiconductor device such as an IC or an LSI has increased considerably. As regards projection exposure apparatuses, filling the major role in the fine processing technology for semiconductor wafers, there are various exposure apparatuses developed, such as a unit-magnification projection exposure apparatus (mirror projection aligner) wherein an exposure process is performed while scanningly moving a mask and a photosensitive substrate relative to a unit-magnification mirror optical system having an arcuate exposure region, or a reduction projection exposure apparatus (stepper) wherein an image of a mask pattern is formed through a refraction optical system on a photosensitive substrate and the photosensitive substrate is exposed in a step-and-repeat process.

The size of the chip pattern of one semiconductor device is increasing. Thus, for a projection exposure apparatus, it is required to enlarge the exposure area by which a large area pattern of a mask can be printed on a photosensitive substrate.

In order to meet these requirements, various proposals have been made in relation to a step-and-scan type scanning projection exposure apparatus (exposure apparatus) which provides a high resolution and an enlarged picture field size. In such a scan type exposure apparatus, a pattern on the surface of a reticle is illuminated with a slit-like light beam and, while the pattern as illuminated with the slit-like light beam is projected by a projection system (projection optical system), it is transferred onto a wafer through a scanning operation.

Many proposals have been made on such a scan type projection exposure apparatus, and there is an example in which a unit-magnification scan type exposure apparatus with a conventional reflection projection optical system is modified and refraction elements are incorporated into the projection optical system, such that reflection elements and refraction elements are used in combination. Another example is a scan type exposure apparatus wherein a reduction projection optical system comprising refraction elements only is used and wherein both of a mask stage and a stage (wafer stage) for a photosensitive substrate are scanningly moved in synchronism with each other at a speed ratio corresponding to the reduction magnification.

FIG. 23 is a schematic view of a main portion of a scanning exposure apparatus. In the drawing, a mask (reticle) 1 on which an original is formed is supported by a mask stage 3. Wafer (photosensitive substrate) 13 is supported by a wafer stage 5. The mask 1 and the wafer 13 are disposed in an optically conjugate relationship with each other, with respect to a projection optical system 2. Slit-like exposure light 12 coming from an illumination system (not shown) and being elongated in the Y direction in the drawing, illuminates the mask 1 by which it is imaged upon the wafer 13 with a size corresponding to the projection magnification of the projection optical system 2. A scan exposure process is performed by moving both of the mask stage 3 and the wafer stage 5 relative to the slit-like exposure light 12, in other words, relative to the projection optical system 2, at a speed ratio corresponding to the optical magnification, to scan the mask 1 and the wafer 13. By this, the whole device pattern of the mask 1 is transferred onto a transfer region 10 on the wafer 13.

Practically, the scan exposure process is performed to two types of wafers as roughly classified:

(a1) Wafer to which no mask pattern has been transferred (hereinafter "first wafer"); and (a2) Wafer on which a mask pattern or patterns are already formed (hereinafter "second wafer").

When a mask pattern is to be superposedly printed on a second wafer, patterns of a mask 1 and of a wafer 13 may be detected by using mark detecting means 15 and through an alignment optical system 4. The result of the detection may be processed by an operation processing circuit 16. On the basis of this and of the positions of the mask stage and wafer stage as monitored by laser interferometers 7 and 8, mask and wafer alignment may be done. Thereafter, the mask stage 3 and the wafer stage 4 may be moved in synchronism with each other under control by drive control means 17, to perform the scan exposure.

SUMMARY OF THE INVENTION

If a reduction projection optical system is used, it is necessary that a mask 1 to be used is larger than a pattern region, to be defined on a wafer 13, by an amount corresponding to the projection magnification. In order to support such a large mask 1, the mask stage 3 has to be large. Taking into account a drive system for such a mask, an increase in weight is large. This may result in a problem that sliding motion of the mask stage 3 during an actual exposure process causes a shift of the gravity center of the mask stage 3, which in turn may cause an error in attitude of the projection optical system 2, or a considerable shift of it.

Further, driving such a heavy mask stage 3 may cause a problem of vibration of the projection optical system 2, due to a reaction in accelerating the mask stage 3 to a certain speed, or pitching of the mask stage 3 itself. Also, such vibration may cause a change in attitude of the projection optical system 2, which in turn may cause a problem that an image is printed with deviation from a desired exposure region. An image shift on an exposure plane may also result from pitching of the mask stage. Such a deviation attributable to vibration, if it occurs in the scan direction, leads to deterioration of superposition precision. Vibration in a direction perpendicular to the scan direction causes a focus error (defocus and tilt) on the wafer surface. It results in degradation of exposure precision during first wafer processing and second wafer processing.

In order to avoid the effect of vibration of the projection optical system 2, attributable to driving the mask stage 3, it may be necessary that, from a start of acceleration, the mask stage 3 is moved to a position where the effect of vibration can be disregarded, and that the exposure process is initiated from that position. If driving the mask stage causes a large vibration of the projection optical system, a substantial time has to be set from a start of scan motion to a start of exposure. Thus, throughput will be lowered.

Also, the scan distance of the mask stage to the above-described position becomes longer. Since in a scan type exposure apparatus, the scan direction of a mask stage is usually reversed between an odd-number shot and an even-number shot, on a wafer, for enhancement of throughput, the prolongation of scan distance appears both on the opposite sides of the scan direction. This leads to bulkiness of the whole exposure apparatus.

It is an object of the present invention to solve at least one of the above-described problems, and to avoid the effect of vibration, attributable to stage driving, without a decrease of throughput or without an increase of scan distance.

It is another object of the present invention to provide a scan type projection exposure apparatus or a device manufacturing method using the same, by which a high precision exposure process or manufacture of high precision semiconductor devices is assured.

In accordance with an aspect of the present invention, there is provided a scan type exposure apparatus, comprising: a first movable stage on which a first object is to be placed; a second movable stage on which a second object is to be placed; a projection optical system for projecting a pattern of the first object onto the second object; a scanning mechanism for scanningly moving said first and second movable stages in a timed relation with each other, relative to said projection optical system, while the pattern of the first object is projected by said projection optical system onto the second object; storing means for storing therein data corresponding to a change in exposure condition as measured beforehand and to be produced by moving at least one of said first and second movable stages; and control means for controlling drive of said first and second movable stages in an actual exposure process, while reflecting a correction value, as determined on the basis of the data stored, to the drive of at least one of said first and second movable stages.

A scanning exposure method or a semiconductor device manufacturing method having similar features as described above may be provided within the scope of the present invention.

In one preferred form of this aspect of the present invention, the correction value is determined with respect to plural accelerations or speeds of at least one of said first and second movable stages, and the correction value is set variably in accordance with the accelerations or speeds and with directions of them.

In another preferred form of this aspect of the present invention, the correction value is determined with respect to a deviation of a projected image of the pattern of the first object, upon the second object.

In a further preferred form of this aspect of the present invention, the correction value is determined with respect to a focus error of a projected image of the pattern of the first object, upon the second object.

In a yet further preferred form of this aspect of the present invention, the scan exposure is performed while controlling a quantity of exposure light in accordance with a speed of at least one of said first and second movable stages.

In accordance with another aspect of the present invention, there is provided a scan type projection exposure apparatus, comprising: a first movable stage on which a first object is to be placed; a second movable stage on which a second object is to be placed; a projection optical system; scanning means cooperable with said projection optical system, for scanningly moving said first and second movable stages in a timed relation with each other and at a speed ratio corresponding to a projection magnification of said projection optical system so that a pattern of the first object is projected by said projection optical system onto the second object; detecting means for measuring a position of an image plane of the first object defined by said projection optical system; storing means for storing therein image plane positions as measured by said detecting means while scanningly moving said first movable stage, as correction values related to image plane positions at different scan positions of said first movable stage; and driving means for moving the second object in a direction of focus on the basis of the image plane positions stored in said storing means, to set the second object with respect to the image plane position.

In one preferred form of this aspect of the present invention, before image plane position measurement during scanning motion of said first movable stage, said detecting means detects image plane position information of the first object defined by said projection optical system as said first movable stage is held fixed, on the basis of which image plane position information said detecting means calculates information related to image plane positions with respect to different scan positions of said first movable stage.

In another preferred form of this aspect of the present invention, said detecting means includes an illumination light source for projecting illumination light onto the first object, a first slit for passing a portion of the illumination light and provided to the surface of the first object, and light receiving means for detecting light, of the illumination light, passed through said first slit and through said projection optical system, wherein said detecting means detects information related to image plane positions of the first object with respect to different scan positions of said first movable stage, as defined by said projection optical system, on the basis of a signal produced by said light receiving means.

In a further preferred form of this aspect of the present invention, said detecting means includes an illumination light source for illuminating a second slit mark provided on said second movable stage, and light receiving means for detecting light coming from said second slit mark and through said projection optical system, wherein said detecting means detects information related to image plane positions of the first object with respect to different scan positions of said first movable stage, as defined by said projection optical system, on the basis of a signal produced by said light receiving means.

In a further preferred form of this aspect of the present invention, said light receiving means detects light passed through said first slit and through said projection optical system and then reflected by a reflection surface, provided on said second movable stage and having a surface step structure, and then again passed through said projection optical system and through said first slit.

In a further preferred form of this aspect of the present invention, the first object is formed with a first pattern for image plane position measurement and an observation window for observation of a surface of said second movable stage, wherein said second movable stage is formed with a second pattern for image plane position measurement, wherein said detecting means includes an observation system for simultaneous observation of said first and second patterns, such that said detecting means detects information related to image plane positions of the first object with respect to different scan positions of said first movable stage, as defined by said projection optical system, on the basis of said first and second patterns observed by said observation system.

In accordance with a further aspect of the present invention, there is provided a device manufacturing method, including aligning a reticle and a wafer and then projecting and printing a pattern of the reticle onto the wafer by using a scan type projection exposure apparatus as described above, and then developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3A through 3C are graphs for explaining vibration of a projection optical system due to drive of a mask stage.

FIG. 5 is a schematic view of a reticle with calibration marks for image shift measurement.

FIGS. 6A through 6D are schematic views, showing details of calibration marks.

DESCRIPTION OF THE PREFERRED EMBODIMENTS

Figure 4:
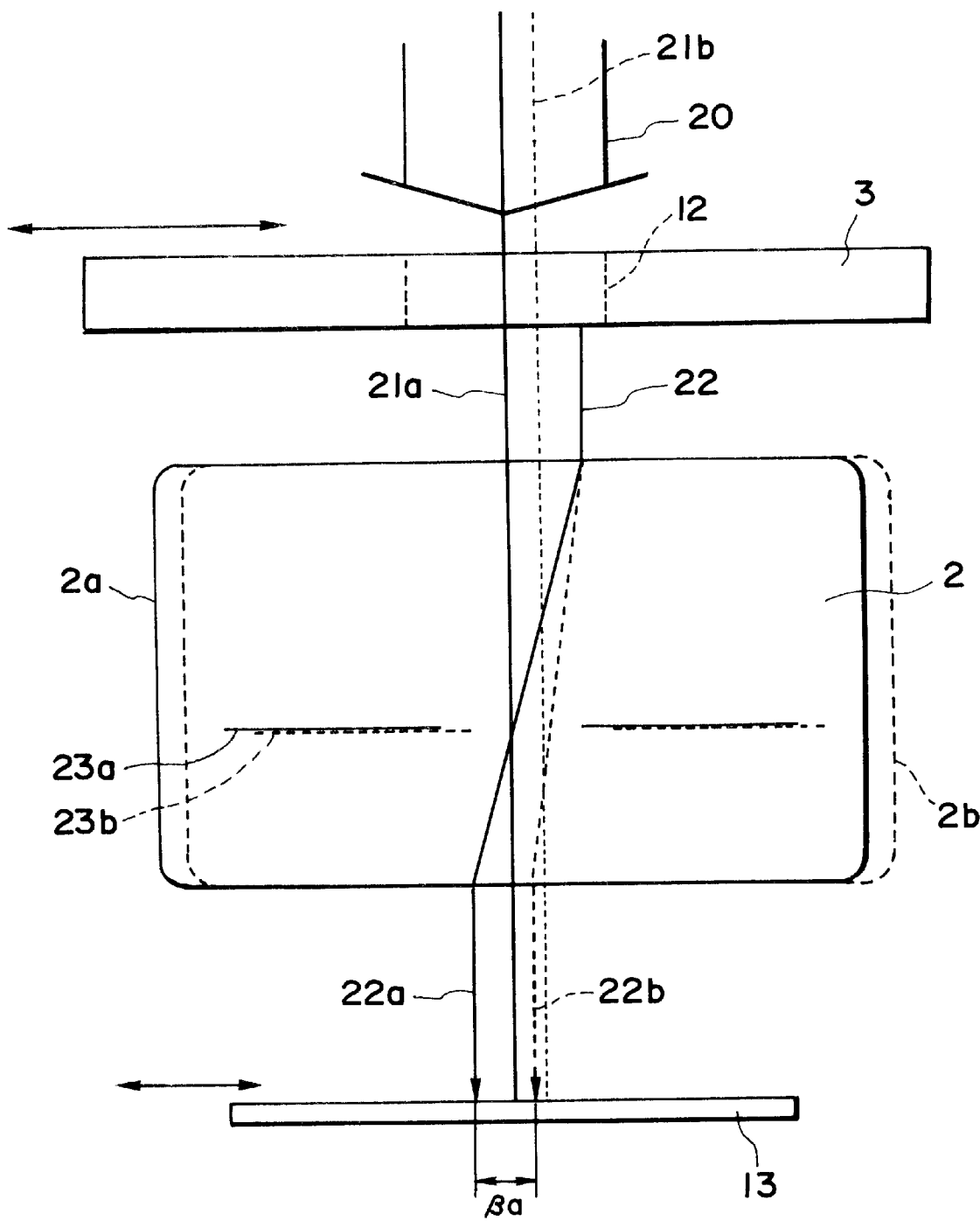
FIG. 4 is a schematic view for explaining an image shift on a wafer, due to vibration of a projection optical system.

Features of the present invention will first be described. Referring to FIG. 4, a case wherein vibration is generated in a projection optical system 2 as a result of drive of a mask stage 3, will now be explained. As the mask stage 3 is driven, the projection optical system 2 vibrates. In the drawing, solid line 2a depicts the projection optical system which is at the center of vibration, in other words, at an idealistic position free of vibration. This position will be referred to as an idealistic position. Broken line 2b depicts the projection optical system which is at a position shifted by vibration or gravity center displacement of the mask stage 3. This position will be referred to as a maximum amplitude position. Denoted at 21a is an optical axis of the projection optical system which is at the idealistic position. Denoted at 21b is the optical axis of the projection optical system which is at the maximum amplitude position.

Light 22 passing a point in an exposure region then passes a pupil 23a of the projection optical system 2a and impinges on a position 22a. For the projection optical system 2b which is at the maximum amplitude position, light 22 goes through a pupil 23b and impinges on a position 22b. From this, it is seen that the imaging position shifts as a result of a change in position of the projection optical system 2 due to vibration. More specifically, if the imaging magnification of the projection optical system 2 is β and the magnitude of maximum amplitude is a, there is produced a shift of imaging position by βa.

FIGS. 3A through 3C illustrate changes in vibration amplitude with changes in scan speed. FIG. 3A shows changes in speed of the mask stage 3 with respect to time. A solid line depicts variation in speed in an idealistic exposure process where no vibration is generated in the projection optical system 2. A dash-and-dot line depicts changes in speed in a case where the scan speed is doubled.

FIG. 3B shows changes in vibration amplitude of the projection optical system 2 with respect to these scan speeds, and an image shift on the wafer 3 surface can be seen therefrom. A solid line depicts a case of idealistic exposure speed, and a dash-and-dot line depicts a case where the speed is doubled. It is seen that, when the speed is doubled, vibration amplitude at point B becomes larger. As a result, although with the idealistic exposure speed there is no effect of vibration at point A, with the double speed there is a large effect of image shift at the same position (point B) in response to a start of exposure. This effect of vibration cannot be removed unless the scan distance is prolonged up to point C. This means that, if the speed is doubled, a distance to the point of optimum exposure position (point C) is required and that the scan distance is consequently enlarged. Additionally, the time to the start of the exposure process is prolonged. This leads to a decrease of throughput. Alternatively, if the movement distance of the mask stage has only a stroke that is determined by the idealistic exposure speed (solid line), doubling the speed and performing the exposure process will end in an image shift, causing deterioration of exposure precision.

Figure 2:
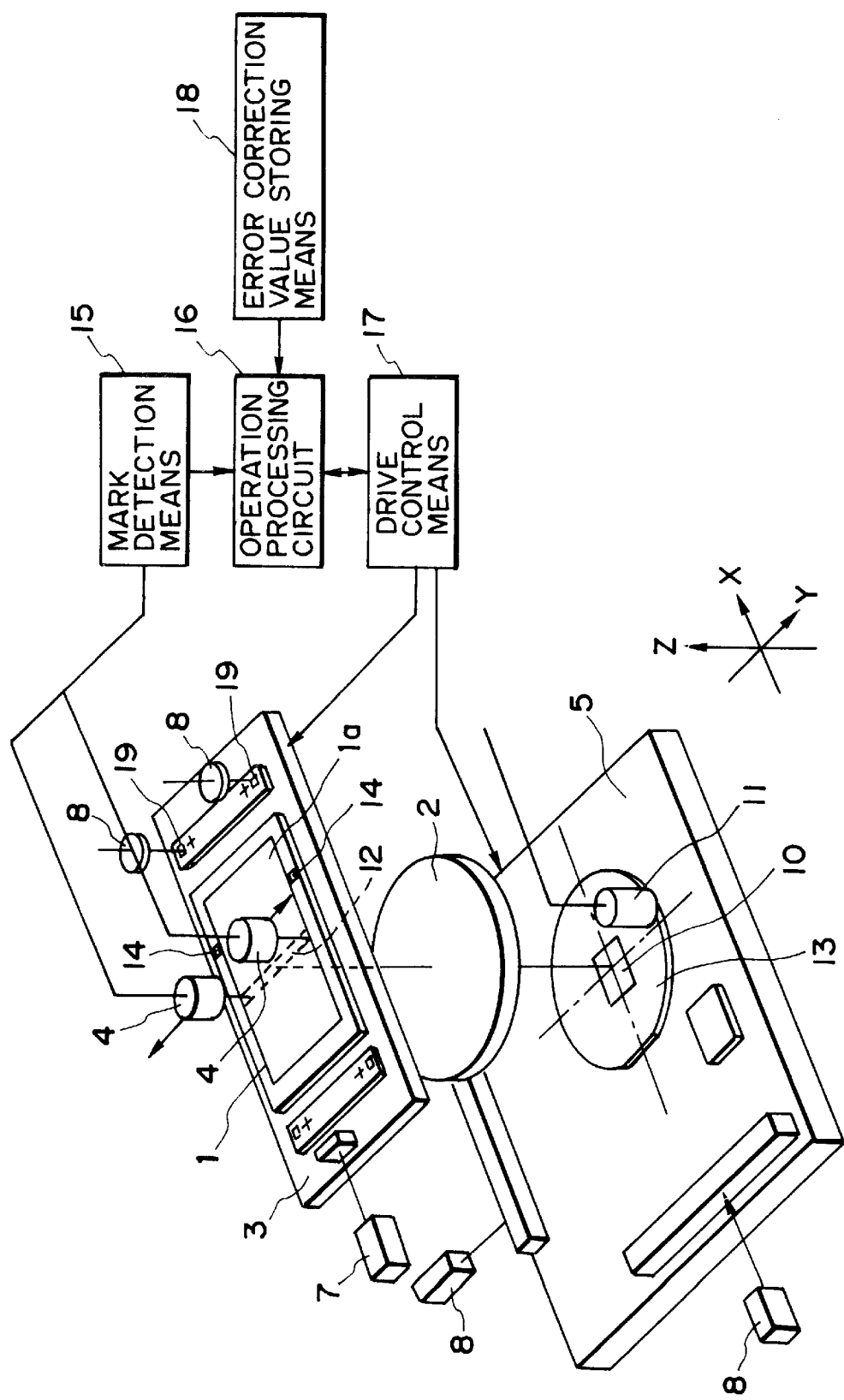
FIG. 2 is a perspective view, showing details of the apparatus of FIG. 1.

In order to perform the exposure process with a doubled scan speed, for example, the amount of offset produced by vibration after point B may be measured beforehand and may be stored into storage means 18 (FIG. 2). During the exposure process, the speeds of the wafer stage 5 and the mask stage 3 may be controlled and changed to the speed (exposure position), taking into account the offset amount. On that occasion, exposure amount control to a resist of the wafer may also be changed with respect to speed, by which optimum scan exposure may be assured.

In addition to the control with respect to the position in the scan direction, the amount of offset of focus error (defocus or tilt) upon the surface of the wafer may be measured beforehand and stored into the storage means 18. In the exposure process, these offsets may be reflected to focus drive of the wafer stage 5, independently of each other.

Figure 1:
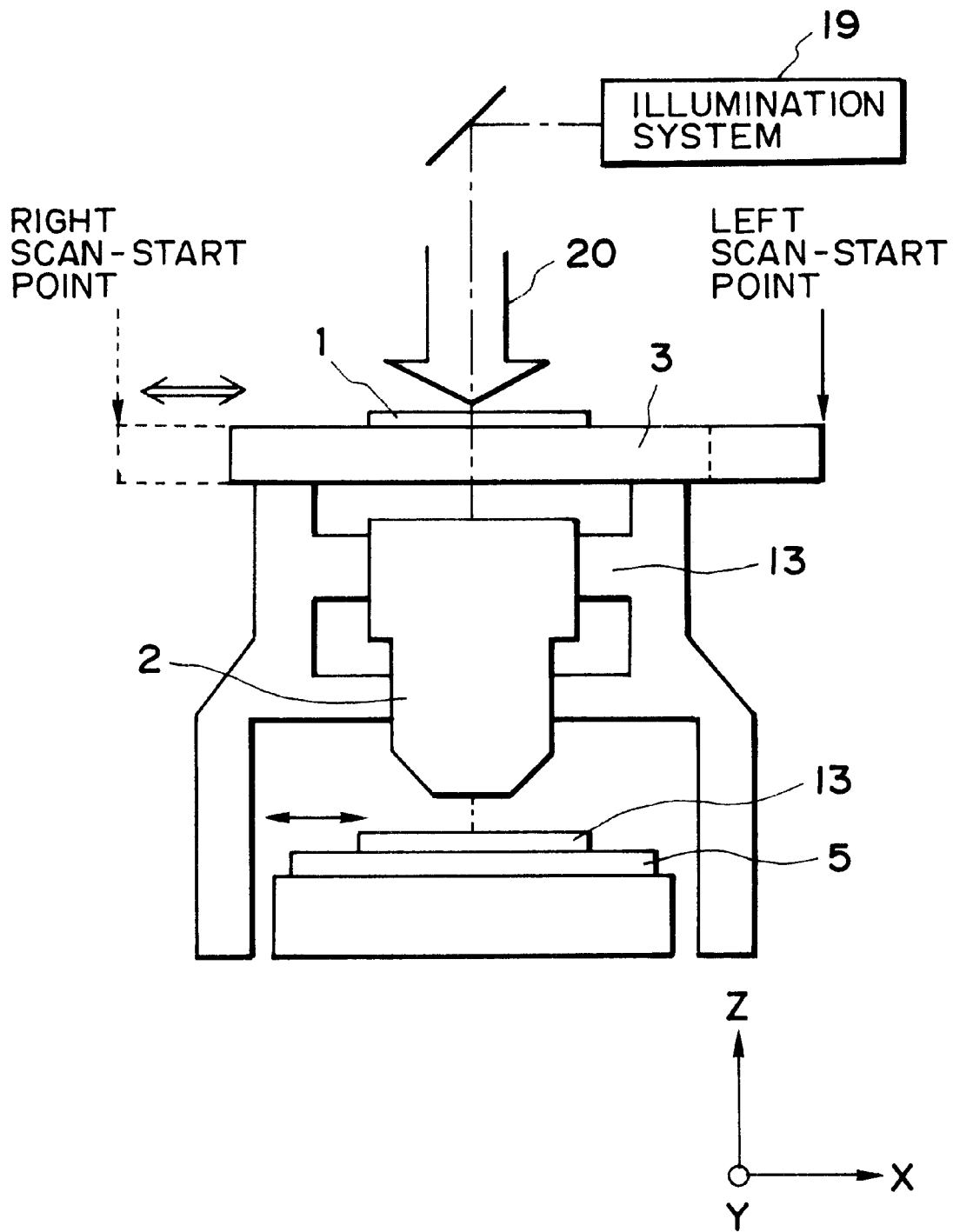
FIG. 1 is a schematic view of a scan type exposure apparatus according to a first embodiment of the present invention.

FIG. 1 is a schematic view of a scan type exposure apparatus according to a first embodiment of the present invention. FIG. 2 shows details of the exposure apparatus of FIG. 1. In the apparatus illustrated, exposure light 20 from an illumination system 19 illuminates a slit-like exposure region of a mask (reticle) 1 supported by a mask stage 3, the exposure region being elongated in a direction (Y direction) perpendicular to the sheet of the drawing. As shown in FIG. 2, the position of the mask stage 3 in the X direction is monitored by means of a laser interferometer 7. Similarly, a wafer stage 5 supports a wafer 13 and it is movable in X and Y directions. The position of the wafer stage with respect to the X and Y directions is monitored by means of laser interferometers 8 associated with these directions, respectively. The wafer stage 5 and the mask stage 3 are position-controlled, respectively, by drive control means 17, and their positions are actuated in accordance with information to be described later.

A mask alignment position detecting system (observation microscopes 4 and 8) observes alignment marks 14 and 19 formed on the mask 1 and the mask stage 4, respectively, and operates for alignment of the mask 1 with respect to the mask stage 3. A position detecting system (off-axis observation microscope 11) provided above the wafer 13 observes an alignment mark (not shown) formed on the wafer 13, and operates to perform measurement of alignment errors of chips and to perform position alignment of the wafer 13.

The wafer stage 5 and the mask stage 3 are moved for alignment of the mask 1 and the wafer 13, on the basis of alignment measured values provided by the position detecting systems 4, 8 and 11. After this, the drive control means 17 operates in response to an output signal from a processing circuit 16, to drive the wafer stage 5 and the mask stage 3 in synchronism with each other, at a scan speed Vw for the wafer stage 5 and at a scan speed Vm (=βVw) for the mask stage 3. Scan exposure is performed during this movement.

Here, a case wherein the projection optical system 2 vibrates due to acceleration motion of the mask stage at the start of a scan such that a shift of the exposure region results, will be considered. As shown in FIGS. 3A and 3B, the projection optical system vibrates due to the effect of acceleration. The amplitude of this vibration depends on the acceleration magnitude A, and the magnitude of image shift is peculiar to individual apparatuses and is produced with reproducibility. Namely, offset by image shift can be expressed, for each exposure apparatus, taking the scan position P (it corresponds to a time from a start of scan) and the acceleration A as variables. Thus, image shift offset is OSF(A, P). In consideration of this, the magnitude of image shift to be produced in relation to the acceleration A and scan position P may be measured beforehand, and correction values for image shift correction may be stored into the storage means 18. By using a stored correction value, an output signal applied to the drive control means 17 from the processing circuit 16 is corrected to thereby correct the speed (exposure start position) in scanning exposure. Since, on this occasion, the change in speed due to correction is very small, it may be considered that substantially no vibration is produced in the projection optical system 2 by the speed change.

Figure 7:
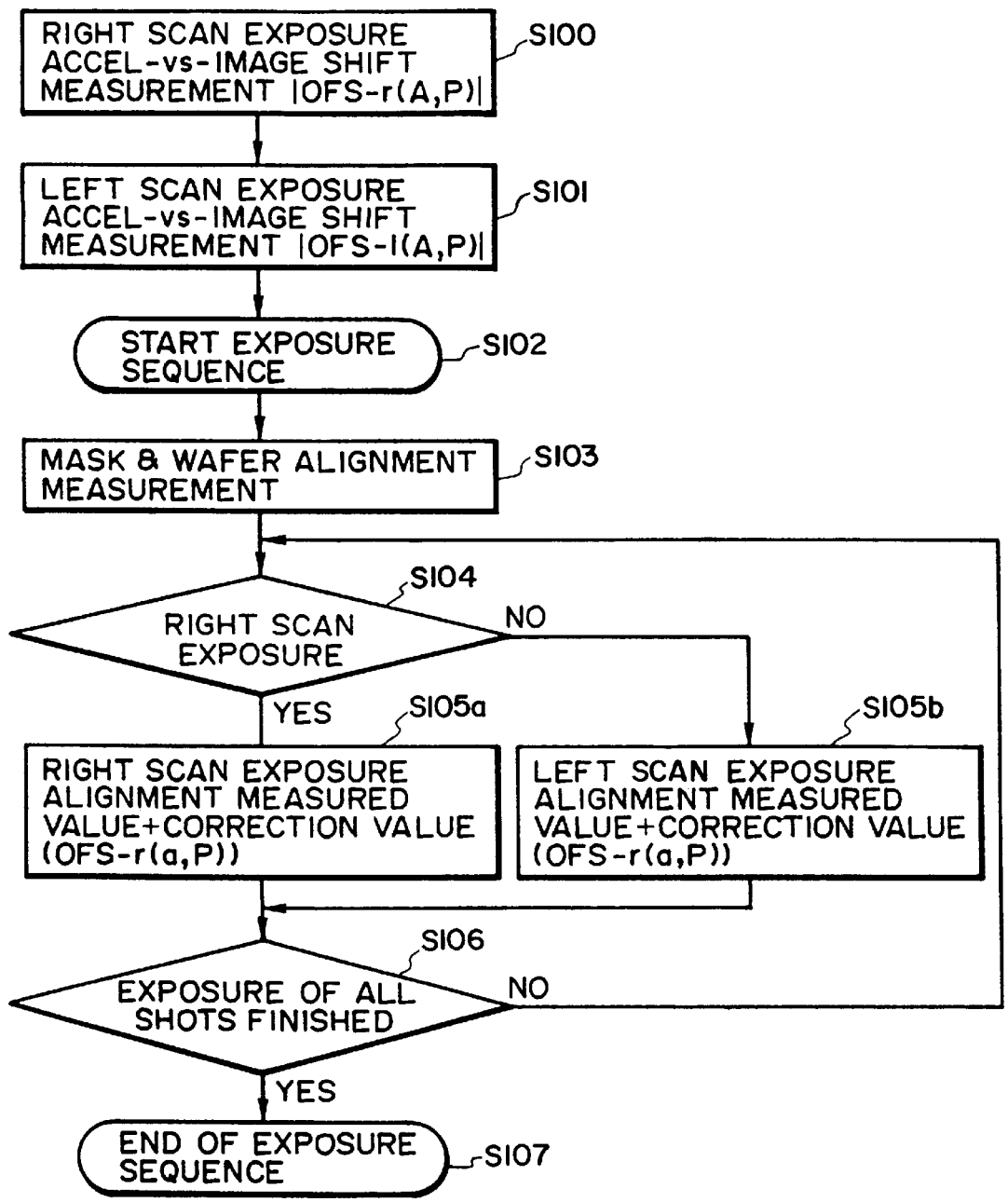
FIG. 7 is a flow chart for explaining an example of operation of the apparatus of the first embodiment.

Referring to FIGS. 5 and 7, the process of measuring the amount of image shift in scanning exposure will be explained. FIG. 5 shows a reticle 1 having calibration marks CMr, CMo and CMi for image shift measurement. Each of these calibration marks CMr, CMo and CMi is disposed along the scan direction (X direction in FIG. 2). Calibration marks CMi and CMr are placed in peripheral portions of the reticle 1 in a direction perpendicular to the scan direction, and calibration mark CMo is placed in a central portion of the reticle 1.

FIGS. 6A through 6D show details of marks CMi, CMr and CMo. Each of the marks CMi, CMr and CMo comprises box-in-box type calibration marks Mo and Mi, that is, outside marks Mo shown in FIG. 6A and inside marks Mi shown in FIG. 6B.

By using the reticle 1 with the mark structure described above, a resist pattern of these marks CMi, CMr and CMo (Mo and Mi) is printed on a first wafer.

For a first-wafer procedure and in a case where the exposure process is to be performed with an apparatus with respect to which the offset measurement is to be done, if a usual scan speed is selected for the scanning exposure, the same offset will be produced in a second-wafer procedure (offset measurement exposure) and it will end in failure of offset measurement. In order to avoid this, a separate exposure apparatus (stepper), of a non-scan type wherein exposure of one shot is done at once, may be used to perform the first-wafer procedure. Practically, however, there is a possibility of a difference in performance between different apparatuses (e.g., a difference in magnification, distortion, etc.) or a problem called "mix-and-match", it is still desirable to use the same apparatus to perform the first-wafer procedure.

Preferably, the scan exposure may be performed with a scan speed which is sufficiently lower than a usual scan speed for normal scan exposure and which does not produce vibration of the apparatus as a whole. Alternatively, without scan exposure, step exposure of only the exposure region may be made to the reticle and the wafer.

To a wafer 13 having marks Mo as a resist pattern, a superposed printing exposure process is performed. At this time, the exposure process is performed with a shift (a magnitude of shift shown in FIG. 5) between the reticle and the wafer with respect to a direction perpendicular to the scan direction, so that marks Mi of the reticle 1 are superposed on the marks Mo as formed in the first-wafer procedure.

If there is no image shift due to scan, the mark pattern formed on a wafer is such as shown in FIG. 6C, wherein a smaller inside square is formed within an outside square. In the case illustrated, for example, a resist remains in a portion painted. No resist is left in a blank portion. The magnitude of shift can be determined by measuring, with regard to these marks so formed, a deviation of the center of an inside square to the center of an outside square.

In a second-wafer procedure, FIG. 6D shows an example of marks as formed by exposure with a usual scan speed. In a case where an image shift occurs due to vibration of the apparatus during scanning exposure, as illustrated, an inside mark shifts relative to an outside square mark. Additionally, the magnitude of this shift changes with the position in the scan direction. The magnitude of shift is determined by the reticle scan position or scan direction. By measuring the magnitude of the shift, the magnitude of image shift during scanning exposure can be determined. Image shift offset with respect to the reticle position, as determined such as above, may be kept in the apparatus and, during an actual device exposure process, the scan speed or position may be controlled so as to cancel the image shift.

Since the mark CMc is already formed on the reticle, the measured value may be taken as offset. If, however, mark CMc cannot be formed at the center of the reticle as in this case, marks CMl and CMr may preferably be located in peripheral portions of the reticle. That is, offset calculation may be made from an average of the shift magnitude measured in relation to the mark CMl and the shift magnitude measure in relation to the mark CMr.

In the example described above, a resist pattern is formed on a first wafer to produce a second wafer. As an alternative, a first wafer having marks Mo (such as a wafer with a surface step structure of Si) may of course be used. That is, a resist may be applied to such a wafer and then superposed printing may be performed to it so that, similarly to the above-described example, marks Mi of the reticle are superposed on the marks Mo of the wafer. Offset measurement is enabled, similarly. Further, in that case, offset measurement may be repeated as desired, by removing the resist material.

In the examples described above, marks Mi of a reticle are superposed on marks Mo of a first wafer. However, the procedure is not limited to this. A similar measurement is attainable with such a mark formation that marks Mo of a reticle are superposed on marks Mi of a first wafer.

Further, while the examples described above use box-in-box type calibration marks, the shape of the mark is not limited to this. Any other marks such as one called a "vernier", for example, may be used for superposed printing to first-wafer marks and for shift measurement. A similar offset measurement is attainable therewith.

A correction value as measured through a process, such as described above, is stored into storage means 18.

The correction value varies with the scan direction. FIG. 3C illustrates vibration resulting from scan motion in a direction opposite to that of the case of FIG. 3B. It is seen that, as compared with the amplitude at a point in condition 2 of FIG. 3B, the amplitude at a corresponding point in condition 3 of FIG. 3C is negative. This means that the amplitude is inverted. Thus, it is necessary to prepare a correction value corresponding to the scan direction. During the exposure process, a corresponding one may be reflected in accordance with the scan direction. In the following, in accordance with the direction shown in FIG. 1, the scan exposure along condition 2 will be referred to as "leftward scan exposure", and the scan exposure along condition 3 will be referred to as "rightward scan exposure".

Now, a case of scan exposure wherein the correction value is taken into account in regard to scan exposure of a second wafer, will be explained.

FIG. 7 is a flow chart of a scan exposure operation in that case. First, at steps S100 and S101, image shift offset to be produced with acceleration A is measured prior to the scan exposure, in the manner described hereinbefore. Correction values corresponding to measured offset values are stored. Here, an offset to be produced in rightward scan exposure will be referred to as offset $OFS_{\_r}(A,P)$ and an offset to be produced in leftward scan exposure will be referred to as offset $OFS_{\_l}(A,P)$. These offsets may be those as measured in relation to acceleration A and scan position P during actual scan exposure, and they may be measured with respect to various accelerations A. They may be stored into the storage means 18 as a data table, such that any change in scan speed can be met easily. The offset may be kept as a function of acceleration A and, on that occasion, the necessity of offset measurement to a given acceleration A may be omitted.

Subsequently, at step S102, the exposure sequence starts. At step S103, alignment marks 14 and 14 formed on a mask 1 are measured by using the position detecting system 4 and 4, and an alignment operation to the mask 1 and the mask stage 3 is performed. Also, by using the position detecting system 11 disposed above the wafer 13, alignment marks (not shown) of the wafer 13 are observed, and an alignment operation is performed so as to assure optimum superposed exposure. On the basis of positional information so produced, scan exposure will be performed to be described later. In a scan type exposure apparatus, for enhanced throughput, during the exposure process, the mask stage is usually reciprocated in accordance with the shot layout on the wafer. Thus, at step S104, the scan direction of the mask stage 3 is discriminated and, if it is rightward scan exposure, the sequence goes to step S105a. If it is leftward scan exposure, the sequence goes to step S105b. At step S105a, on the basis of offset $OFS_{\_r}(A,P)$ as measured prior to the alignment measurement, the drive control means 17 controls motion of the mask stage 3 and the wafer stage 5, and the scan exposure is performed while controlling the exposure speeds of these stages.

Here, the exposure amount may also be controlled so as to assure constant illuminance to the exposure region of the wafer 13 with any variation in scan speed. This avoids the effect of a non-uniform exposure amount in the wafer 13 or in a shot 10. To this end, if a pulse emission type light source such as a KrF excimer laser, for example, is used, the number of pulses to be emitted or the frequency thereof may be controlled. Similarly, at step S105b, scan exposure may be performed on the basis of offset $OFS_{\_l}(A,P)$. Since the projection exposure process is carried out with control, taking into account the offset, the time until the effect of vibration of the projection optical system and the stroke therefor can be omitted. Improvement of throughput and reduction in size of the apparatus are therefore assured.

At step S106, a discrimination is made as to whether exposure of all the shots of one wafer is completed or not. If not, the sequence goes back to step S104. If completed, the sequence goes to step S107, whereby the exposure sequence finishes. Unless any condition of the exposure apparatus (e.g., acceleration A of the mask stage 3) is changed, the procedure from step S102 to step S107 may be repeated to process plural wafers.

When acceleration A of the mask stage 3 is changed, scan speed control using a corresponding offset which is based on the data table stored in the storage means 18 as well as exposure amount control may be made to execute the scan exposure.

In the foregoing examples, a description has been made with reference to the effect of image shift produced by vibration of the projection optical system 2. However, when the projection optical system 2 vibrates, additionally there will occur a focus error or a tilt component error with respect to the wafer surface. Similar correction may be made to these error components. More specifically, an offset to be produced in relation to acceleration A and scan direction, may be measured beforehand and then, while executing the scan exposure, the wafer stage 5 may be correction-driven in the focus direction of the projection optical system. This assures high precision scan exposure and prevents enlargement in the size of the apparatus, and enables enhancement of throughput.

Figure 8:
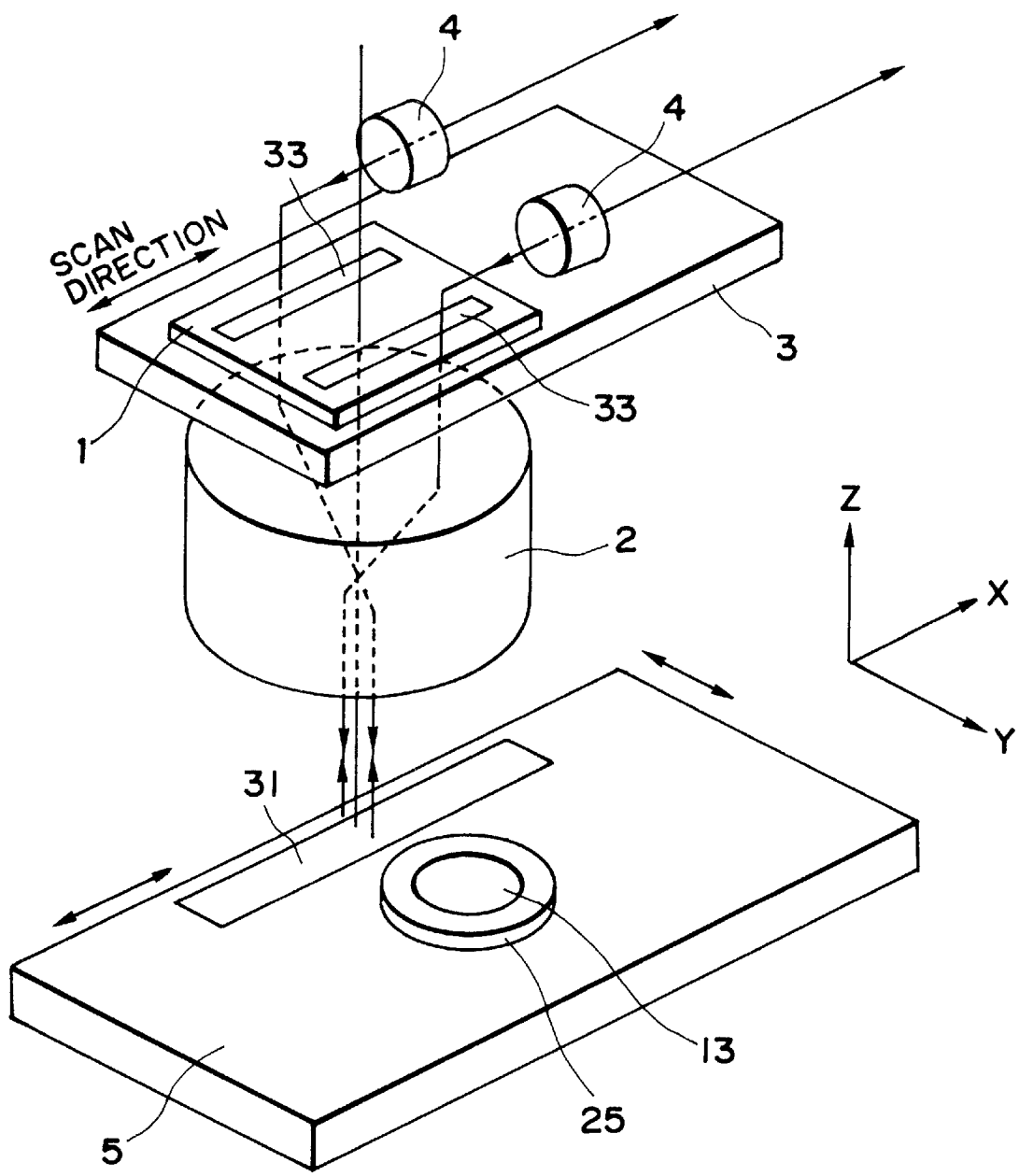
FIG. 8 is a schematic view of a scan type exposure apparatus according to a second embodiment of the present invention.
Figure 9:
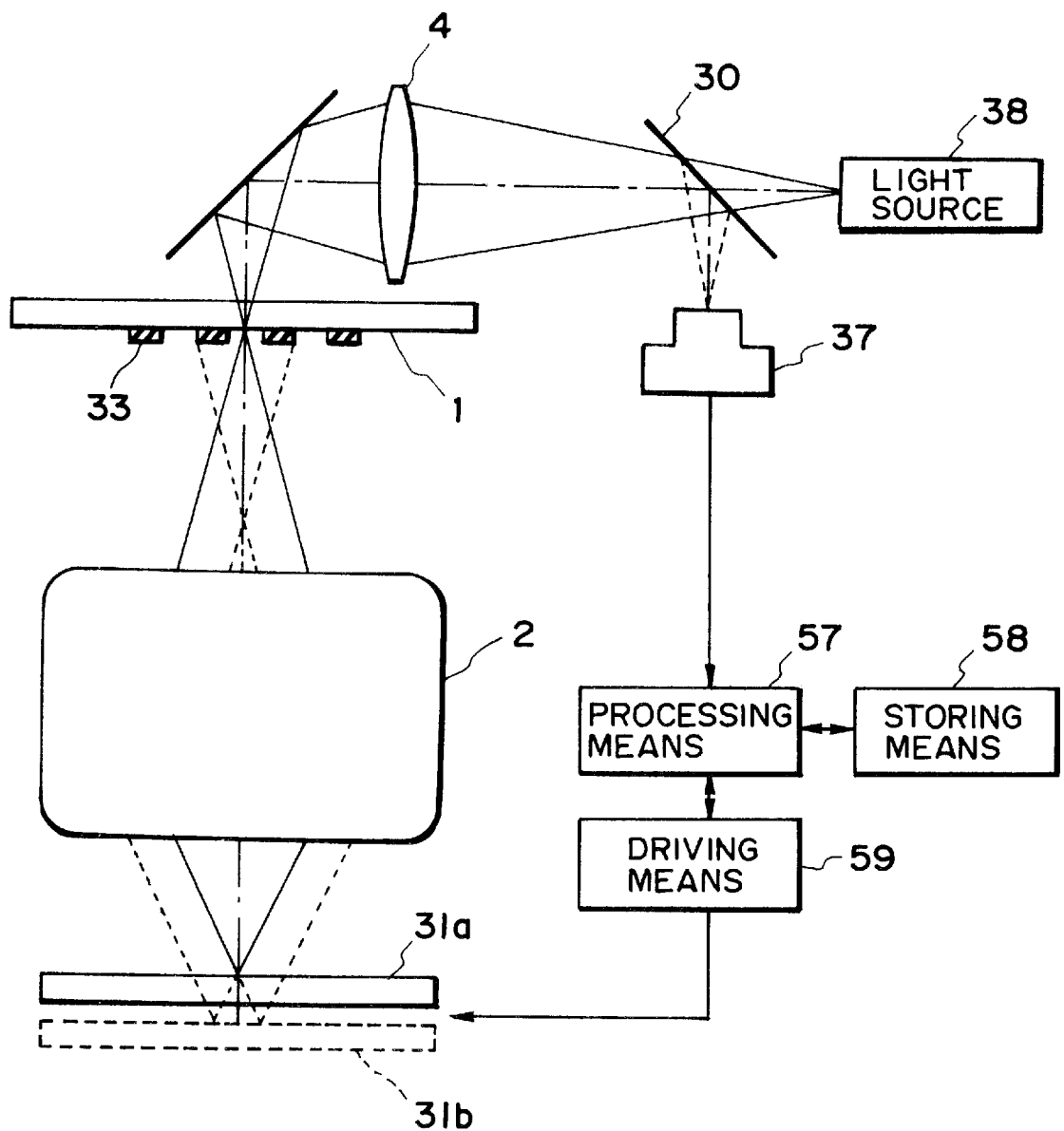
FIG. 9 is a schematic view for explaining a detection process according to the second embodiment of the present invention.

FIG. 8 is a schematic view of a main portion of a scan type exposure apparatus according to another embodiment of the present invention, wherein correction in focus direction is enabled. FIG. 9 is a schematic view for explaining how to detect the imaging plane (focus plane) of a projection optical system.

Denoted in these drawings at 1 is a reticle or photomask (first object) having a circuit pattern formed on its bottom surface by chromium deposition, for example. Denoted at 3 is a mask or reticle stage (first movable stage) which is movable in X and Y directions. Denoted at 2 is a projection lens (projection optical system) for projecting the circuit pattern of the reticle 1, as illuminated by an exposure illumination system (not shown), onto a wafer (second object) 2 held by a wafer chuck 25. The wafer chuck 25 is mounted on a wafer stage (second movable stage) 5.

In this embodiment, the mask stage 3 and the wafer stage 5 are moved in opposite directions by scanning means (not shown) such as a motor, for example, in synchronism with each other along the scan direction (X direction), exactly at constant speeds with a speed ratio corresponding to the imaging magnification of the projection lens 2, by which scan exposure is executed.

Denoted at 4 is a focus detecting system. In FIG. 8, illumination light (exposure light) from an illumination optical system (not shown) enters the focus detecting system 4, and it illuminates the reticle 1 held on the mask stage 3. The illumination light goes through a slit pattern (first slit) 33 (FIG. 11A) formed on the reticle 1 and, thereafter, it passes through the projection optical system 2 and impinges on a reflection surface 31 formed on the wafer stage 5.

The wafer stage 5 is formed with the wafer chuck 25, for supporting a wafer, and the reflection surface 31 for detection of the focal plane of the projection optical system 2. The illumination light passing through the slit 33 of the reticle 1 is reflected by this reflection surface 31, and the reflected light goes back through the projection optical system 2 to the slit 33 of the reticle 1. Light passing again through the slit 33 goes via the focus detecting system 4, and it is received by light quantity detecting means (light receiving means), not shown, whereby the quantity of return light is detected.

The quantity of light passing the slit 33 of the reticle 1 and returning again through the same slit via the projection optical system 2 and the reflection surface 31 changes in dependence upon the focus position of the reflection surface 31 on the wafer stage 5. The quantity of such return light becomes highest with the best focus plane of a projected image of the reticle pattern by the projection optical system 2, and it decreases with the amount of defocus. Thus, by monitoring the detected quantity of light passed through the slit 33, any change in focal plane of the projection optical system 2 can be monitored.

Referring to FIG. 9, detecting means of this embodiment for detecting or measuring an imaging position (focus position) of the reticle 1 defined by the projection optical system 2, by using the slit pattern 33 formed on the reticle (first object) 1, will be explained.

In FIG. 9, light from an illumination light source 38 having an exposure (sensitizing) wavelength, passes through a beam splitter 30 and then through an illumination and detection optical system 4 (hereinafter "detection optical system"), and it illuminates the reticle 1. On the pattern surface of the reticle 1, there is slit means 33 with predetermined spacing. Light passing this slit 33 goes through the projection optical system 2 and impinges on a reflection surface 31a which is formed on the wafer stage, not shown.

Here, if the reflection surface 31a is on the idealistic image plane (best focus plane) with respect to the pattern surface of the reticle 1, the light reflected by the reflection surface 31a goes again through the projection optical system 2 back to the pattern surface of the reticle 1. Since the reflection surface 31a is on the best focus plane, the light passing the slit 33 again passes the same slit and enters the detection optical system 4. Then, by means of the beam splitter 30, it is projected onto a photoelectric converting element (light receiving means) 37.

If the reflection surface 31 is deviated from the idealistic image plane and is located at a position denoted at 31b, light passing the slit 33 and reflected by the reflection surface 31b, as depicted by a broken line, is collected at a defocused position on the reticle 1 side. As a result, the light is defocused with respect to the slit 33 on the pattern surface of the reticle 1 and, therefore, a portion of the light is blocked by the slit 33. Thus, the quantity of light passing therethrough decreases. This means that, by oscillating the reflection surface 31 in the focus direction, the quantity of light passing the slit 33 changes.

Figure 15A:
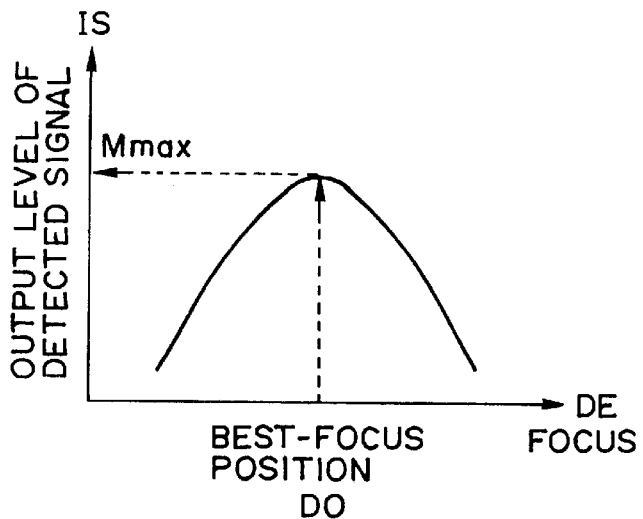
FIGS. 15A and 15B are graphs, respectively, for explaining detection signals obtainable in the second embodiment and a fourth embodiment of the present invention.

The graph of FIG. 15A shows this. The axis of abscissa depicts the position of the reflection surface 31 in the focus direction, and the axis of ordinate depicts the quantity of light coming back through the slit (hereinafter "detected light quantity"). It is seen that the detected light quantity has a peak with the best focus position, and it decreases with defocus. In this embodiment, by detecting the peak light quantity, the best focus plane of the projection optical system 2 with respect to the pattern surface of the reticle 1 is determined.

Detecting means for focus detection described above may be incorporated into a scan type projection exposure apparatus and the detected light quantity may be monitored while scanningly moving the mask stage and the wafer stage, to detect a focus shift of the pattern surface of the reticle 1 upon the wafer surface. Such measurement may be made prior to the exposure process, and the result may be stored into the storing means 18 as offset. On the basis of this offset, during an actual exposure operation, the exposure procedure may be performed while moving the wafer, on the wafer stage 5, in the focus direction. This enables correction of focus shift in the scanning exposure, and assures a desired scan exposure operation.

FIG. 15A illustrates variation, with respect to defocus amount DE of the projection optical system 2, of a detected signal IS, on the axis of ordinate, which is based on the light quantity as detected by the detecting means, wherein the defocus amount DE is taken on the axis of abscissa. Hereinafter, this will be referred to as "profile data".

It is seen that, with respect to the focus position of the reticle image by the projection optical system 2, the detected signal IS becomes largest (MAX) with the best focus position, and it decreases with defocus. Here, the detected signal IS with respect to the defocus amount is peculiar to the apparatus, and it is considered that the intensity of the detected signal with respect to an absolute value of defocus amount is in a one-to-one relation. Thus, by monitoring the intensity of the detected signal IS, an absolute value of defocus amount can be determined.

Figure 15B:
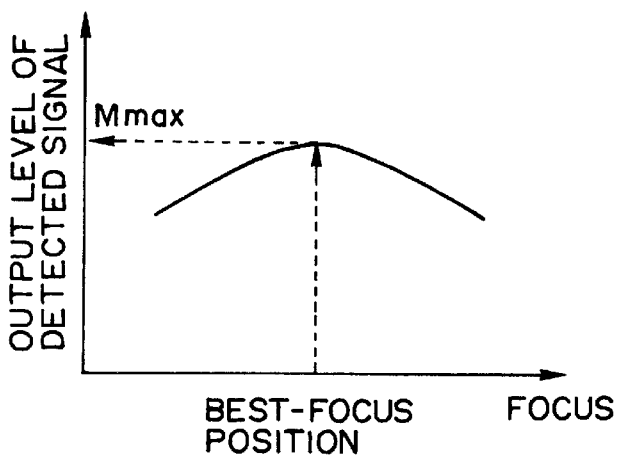

There are cases wherein the projection optical system 2 changes with time and the intensity of the detected signal IS varies with the defocus amount, in a manner such as shown in FIG. 15B. On that occasion, the reflection surface 31 of the wafer stage 5 may be shifted in the focus direction while keeping the position of the mask stage 3 fixed, and the profile may be measured simultaneously. A table of intensity of the detected signal IS with respect to the defocus amount DE may then be stored.

In this embodiment as described above, the intensity of detected signal IS with respect to defocus amount DE as measured is stored into storage means in the form of a table, and the detected light quantity is monitored while scanningly moving the mask stage 3, whereby any change in image plane (focus shift) with the scan of the mask stage 3 is monitored. As one factor for causing image plane variation, there is pitching: during the scan the mask stage 3 shifts vertically (along the optical axis direction) with the scan position. Also, while taking into account the throughput of actual exposure, it is necessary to scan the mask stage 3 at a high speed.

Additionally, there are many components mounted on the mask stage 3 and, therefore, its weight is large. Thus, there is a possibility that the reaction due to acceleration at the start of scan of the mask stage 3 causes vibration or distortion of the projection optical system 2. Such vibration or distortion may cause a change in image plane. The amount of shift of the image plane attributable to these factors is peculiar to the apparatus and, in a short period, it is produced with reproducibility.

Figure 11A:
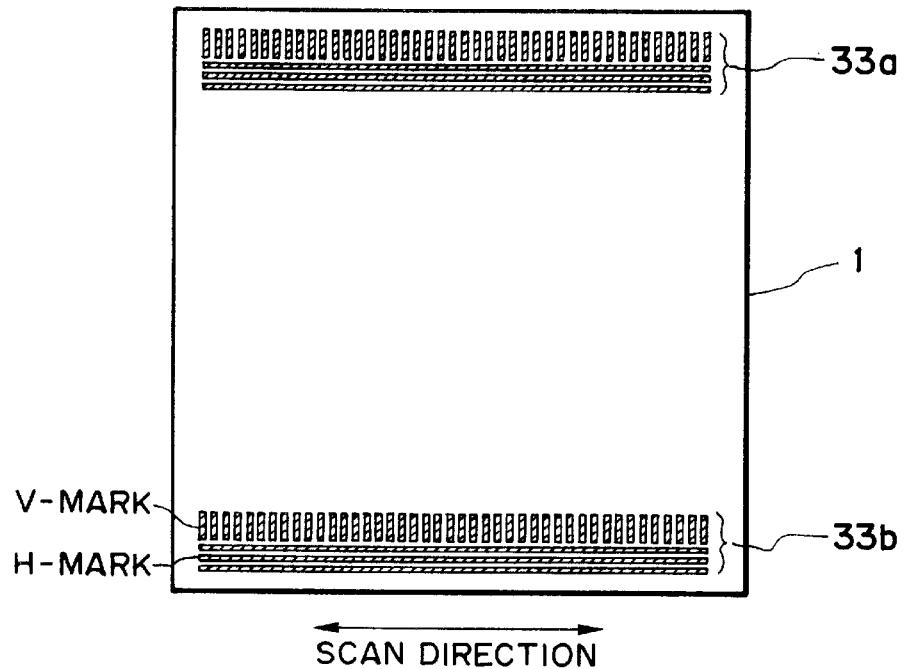
FIGS. 11A and 11B are schematic views, respectively, showing examples of detection marks usable in the second and third embodiments of the present invention.

As for the slit pattern 33 on the reticle 1, as shown in FIG. 11A there are two types of marks: a slit (hereinafter "H mark") which is parallel to the scan direction (X direction) and a slit (hereinafter "V mark") which is in a direction perpendicular to the scan direction. Further, these slits are formed in two groups 33a and 33b being separated in the direction perpendicular to the scan direction. This enables observation of focus change at two locations on the reticle, and thus enables observation of focus change in a direction perpendicular to the scan direction.

That is, from this information, the tilt component of focus is measured. However, if the tilt component is definitely of such an amount that can be disregarded, measurement may be made only to a slit at one side. Further, while two types of slits (H mark and V mark) are used, measurement itself is possible only with one (e.g., H mark) of them.

Figure 16A:
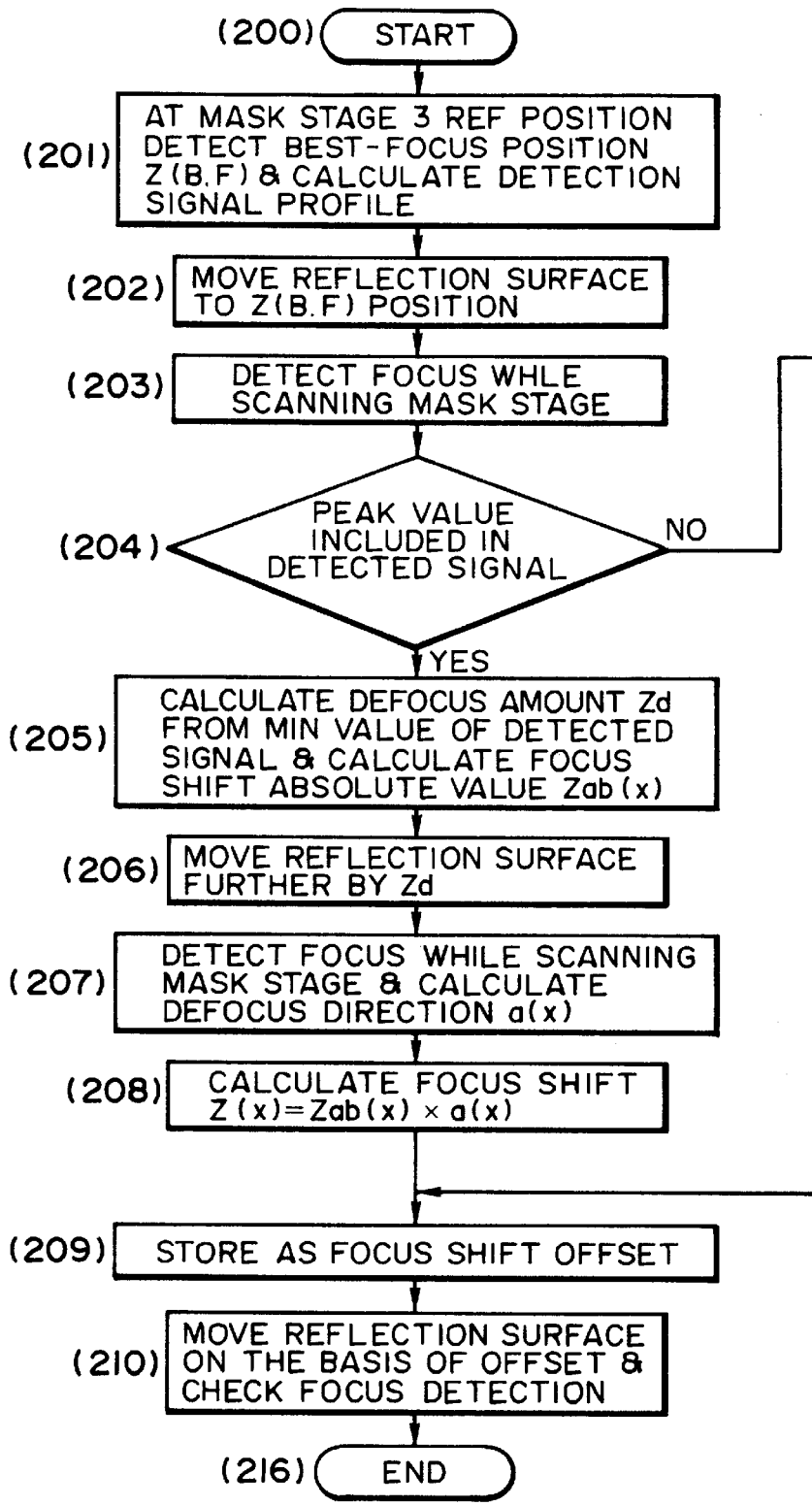
FIGS. 16A and 16B, is a flow chart for explaining a sequence of a measurement procedure in the second embodiment of the present invention.
Figure 16:
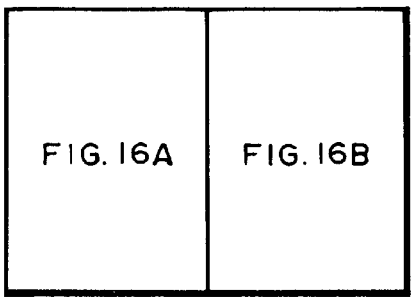
FIG. 16, including
Figure 16B:
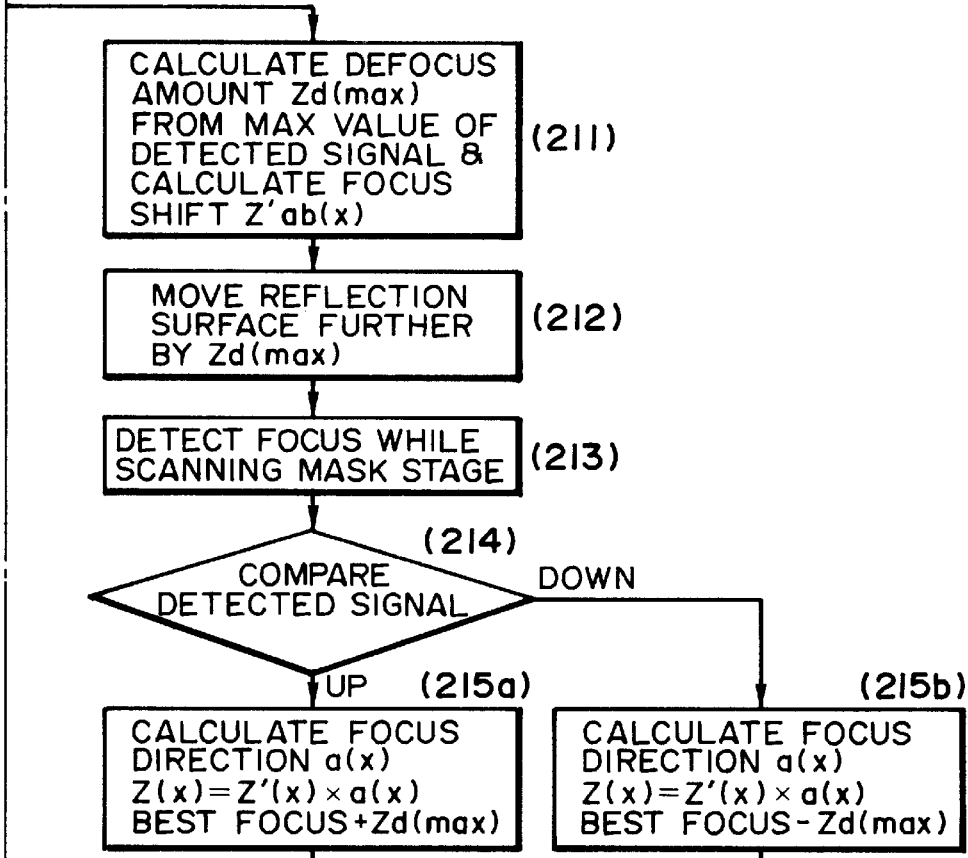

In this embodiment, by using a reticle 1 having a slit pattern 33 as described, any focus shift during scan of the mask stage 3 is measured. Next, referring to the flow chart of FIG. 16, a sequence of an actual measurement procedure will be explained.

When a measurement command is executed with certain timing, the measurement procedure starts (step 200). That is, this measurement procedure may be executed in the course of the main sequence of scan exposure, or it may be performed in response to an input by an operator.

Then, at step 201, the mask stage 3 is moved to a reference position and, there, calculation of best focus position Z(B,F) and profile data (FIG. 15) is carried out. Intensity of a detected signal with respect to defocus is stored in the form of a table. These data are those having been measured in the manner described hereinbefore.

Then, at step 202, the reflection surface 31 on wafer stage 6 is moved to the best focus position Z(B,F) as so determined. Subsequently, without moving the focus position of the reflection surface 31, measurement of detected light quantity (detected signal) is performed while scanning the mask stage 3 (step 203). Here, the sampling timing of measurement with respect to the position of the mask stage 3 is so synchronized that the number of slits in the illumination region (particularly, the number of V marks) is consistent. As described hereinbefore, while a defocus amount can be calculated from a detected signal, the direction thereof is not detectable. Thus, the following sequence is adopted to determine the direction and defocus amount.

At step 203, changes in detected signal with the position of the mask stage 3 are measured. FIGS. 17A–17D, 18A, 18B, 19A and 19B show this. Here, with reference to FIGS. 18A–19B, focus variation will be explained.

In these drawings, an upper curve shows an actual focus shift with the position of the mask stage 3, and a lower curve shows a detected signal.

At step 204, a discrimination is made as to whether a peak Mmax of a detected signal, which is obtainable with the best focus plane, is included in the detected signal corresponding to the mask stage 3 position or not. If a peak Mmax is included in the detected signal, the sequence goes to step 205. This will be explained with reference to FIGS. 17A–17D. In the case wherein a peak Mmax is included (FIG. 17A), at step 205, from a minimum Min of the detected signal, a defocus amount Zd at that position X1 is determined. Also, from the detected signal and on the basis of the profile data, an absolute value Zab(x) of a change in defocus is determined with respect to the position X of the mask stage 3.

Figure 17A:
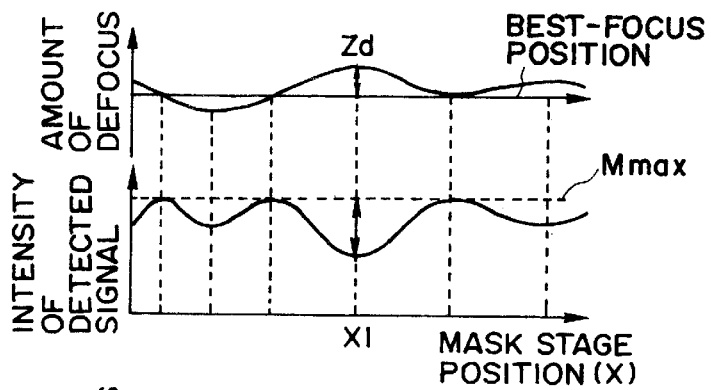
FIGS. 17A–17D are graphs, respectively, for explaining detection signals and focus variation, in the second embodiment of the present invention.
Figure 17B:
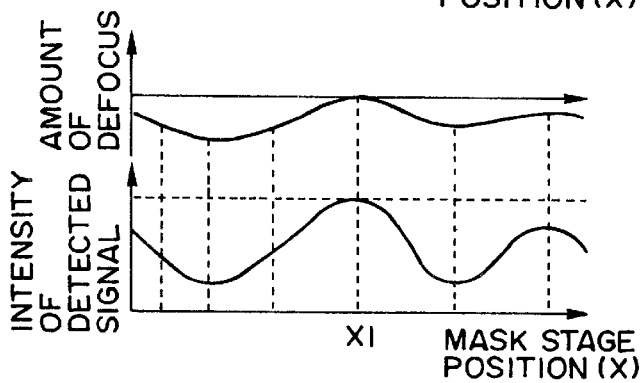

Subsequently, from the defocus amount Zd as determined as described, the reflection surface 31 as a whole is further moved by −Zd (step 206). From that focus position, the mask stage 3 is again scanningly moved, and a detection signal is obtained similarly (step 207). The detection signal produced at this stage of operation shows a maximum Max at position X1 and, while taking that position as a best focus position, it shows the defocus direction (sign a(x)) (FIG. 17B). Namely, by multiplying the absolute value Zag(x) determined at step 205 by a(x) determined at step 207, the focus shift Z(x) during the scan exposure of the mask stage 3 can be determined (step 208: Z(x)=Zab(x)×a(x)).

Figure 17C:
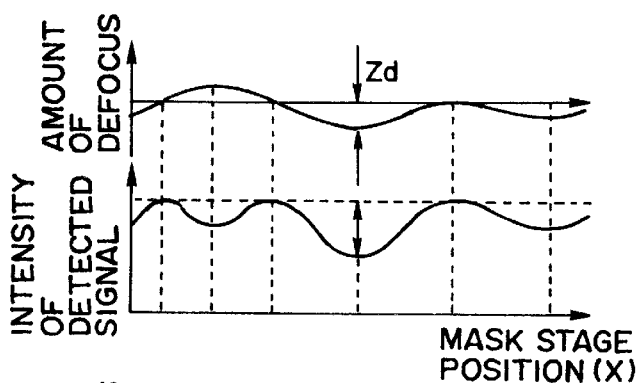
Figure 17D:
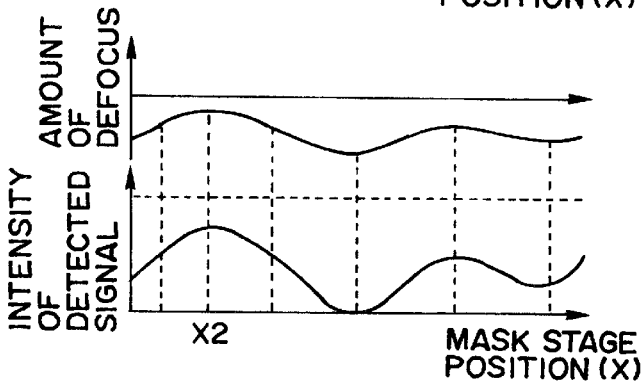

Here, if there is a defocus amount Zd in a negative direction, such as shown in FIG. 17C, the sequence may proceed similarly up to step 207. Here, while taking the position X2, where a peak Max of detected signal appears, as a reference, the direction a(x) of defocus with reference to that position may be determined. Subsequent operation may be made similarly.

The amount of focus shift so calculated is stored as an offset (step 209). At step 210, a detection signal is monitored while moving the reflection surface 31 in accordance with that offset. When no focus shift is discriminated, the sequence is completed (step 210).

The example described above is a case wherein a peak Mmax is included in a detection signal. Turning back to sequence 204, a case wherein there is no peak Mmax included in the detection signal will be explained in conjunction with FIGS. 18A–19B.

At step 211, from a peak Mmax of the detected signal, a defocus amount Zd(max) is calculated. Also, an absolute value Z'ab(x) of focus shift is determined. Then, at step 212, the reflection surface 31 is moved by an amount corresponding to defocus amount +Zd(max) and, while scanning the mask stage 3 again, the focus shift measurement is performed (step 213). There are cases where focus shift is such as represented by FIG. 18A and cases where it is such as represented by FIG. 19A.

Figure 18A:
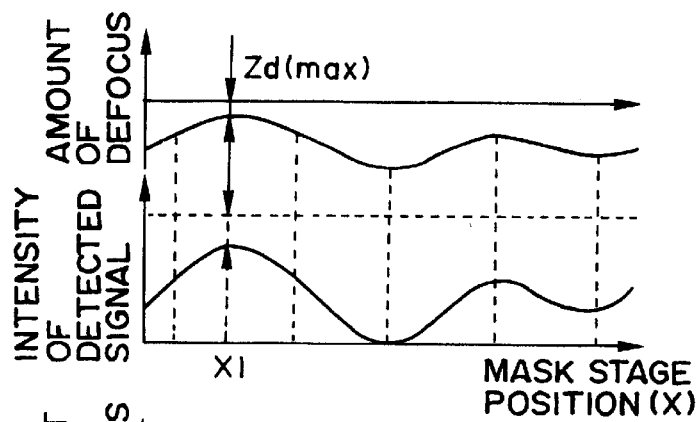
FIGS. 18A and 18B are graphs, respectively, for explaining detection signals and focus variation, in the second embodiment of the present invention.
Figure 18B:
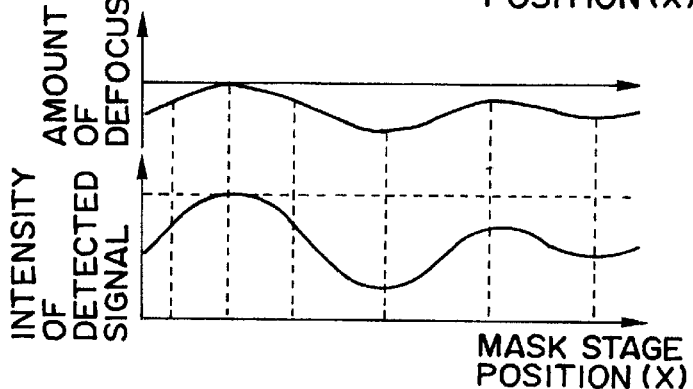

In a case such as shown in FIG. 18A, if the reflection surface 31 is moved by defocus amount +Zd(max), a signal then detected has a peak Mmax and the intensity of the detected signal as a whole is higher than that at the first measurement. Namely, if at step 214 the intensity of the detected signal is increased, the sequence goes to step 215a. There, like step 207, a(x) is determined and, while taking defocus amount Zd(max) as a best focus position, focus change Z(x)=Z'ab(x)×a(x) is calculated.

Figure 19A:
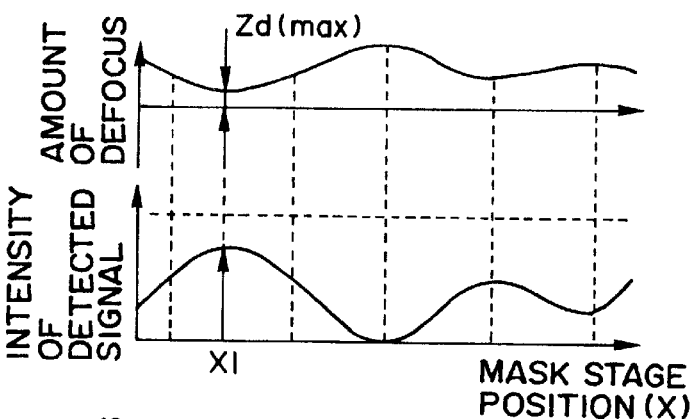
FIGS. 19A and 19B are graphs, respectively, for explaining detection signals and focus variation, in the second embodiment of the present invention.
Figure 19B:
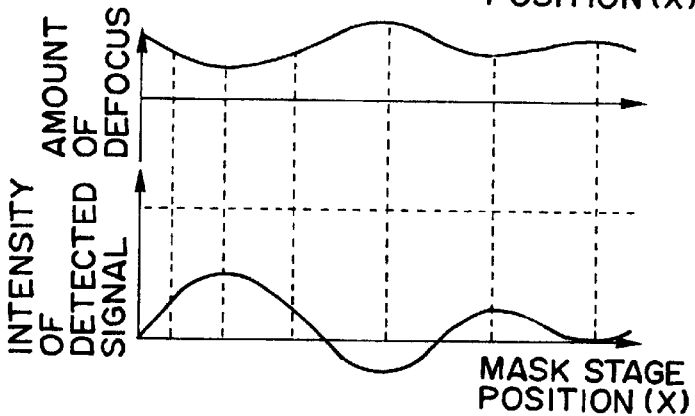

As compared therewith, in a case such as shown in FIG. 19A, the reflection surface 31 is moved by defocus amount +Zd(max) and, then, a signal detected is lower than that produced at the first measurement. Also, a value away from a maximum Mmax is detected. Thus, in such a case, the sequence goes to step 215b and the direction of shift a(x) is determined. Also, while taking the best focus position as −Zd(max), focus change Z(x)=−Z'ab(x)×a(x) is calculated.

The focus shift Z(x) determined as above is similarly stored into the storage means 58 as a focus shift offset and, after the sequence goes to step 210, the procedure is performed similarly.

In the foregoing, although the description has been made to an example wherein measurement is performed with a drive of an amount Zd or a defocus amount Zd(max) to a particular reflection surface 31, the invention is not limited to this. That is, by moving the reflection surface 31 in the focus direction and by executing the measurement twice or more, a focus change (including direction) in the course of scan exposure can be detected.

Focus shift amount Z(x) with the position of the mask stage 3 is determined as described. Such a focus shift Z(x) is peculiar to the apparatus and, while it may change with time in terms of a long time period, it will not change in a short time period (e.g., for a period for exposure of wafers of one lot) and will be produced with reproducibility.

During an actual scanning exposure process, the scan exposure is performed while moving the wafer on the wafer stage 5 in the focus direction to compensate for the focus shift Z(x) determined as above, as offset. This enables correction of focus shift of the projection optical system due to motion of the mask stage 3, and assures high precision scan exposure.

While in the foregoing description the scan is made in one direction, taking into account the throughput in an actual exposure operation, it is possible that the scan exposure is made reciprocally in opposite directions. On that occasion, a focus shift Z(x) may be measured in each of the two directions and, while controlling them as offset, an actual exposure process may be performed. For measurement on that occasion, a first measurement may be made in two directions and, then, a second measurement may be made in two directions. This enables a reduction in time for measurement.

Further, while in the foregoing examples the measurement is performed while scanning the mask stage 3 only, the reflection surface 31 of the mask stage may be formed with elongation in the scan direction and measurement may be made while scanning the wafer stage 5, too.

Figure 10:
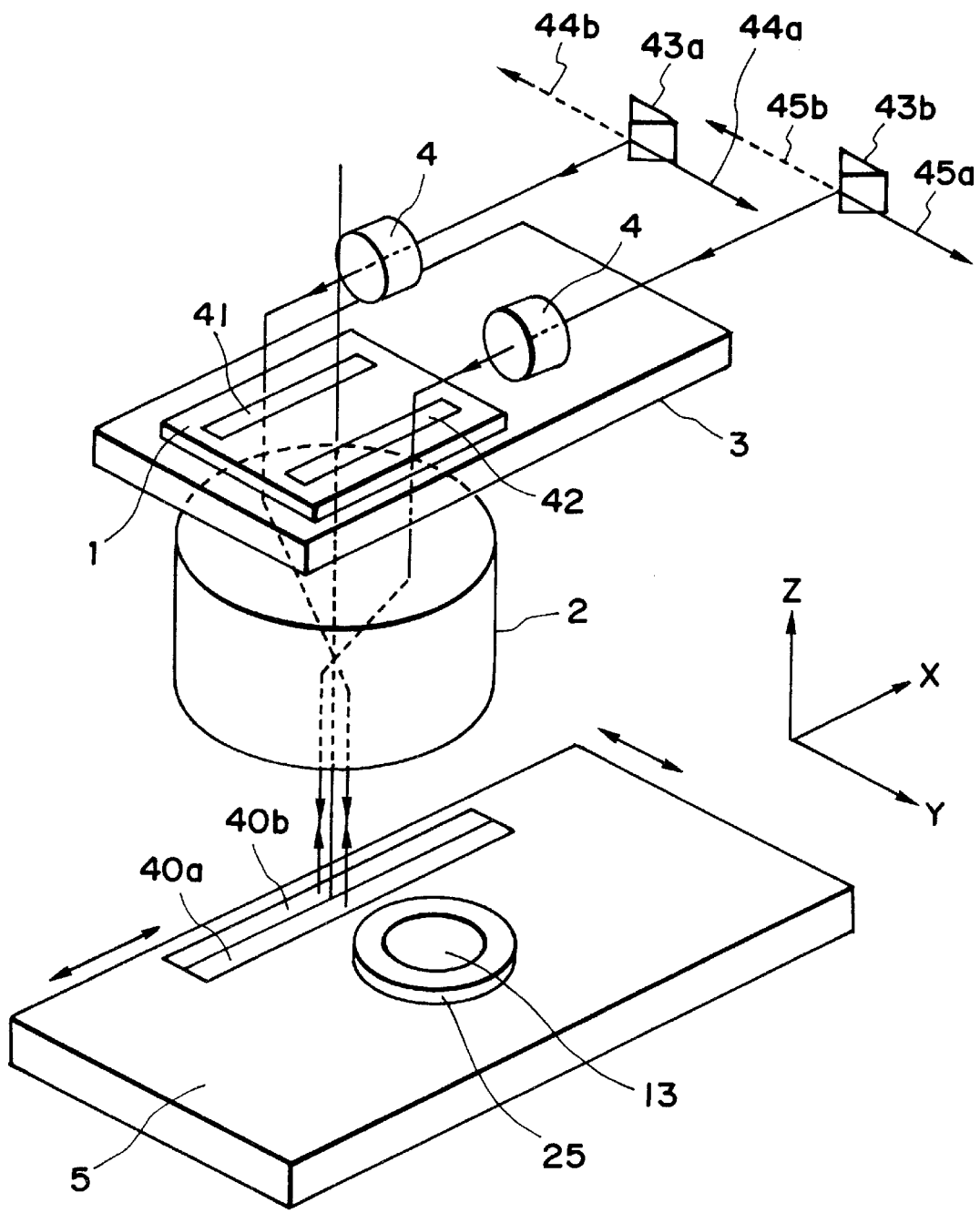
FIG. 10 is a schematic view of a scan type exposure apparatus according to a third embodiment of the present invention.
Figure 11B:
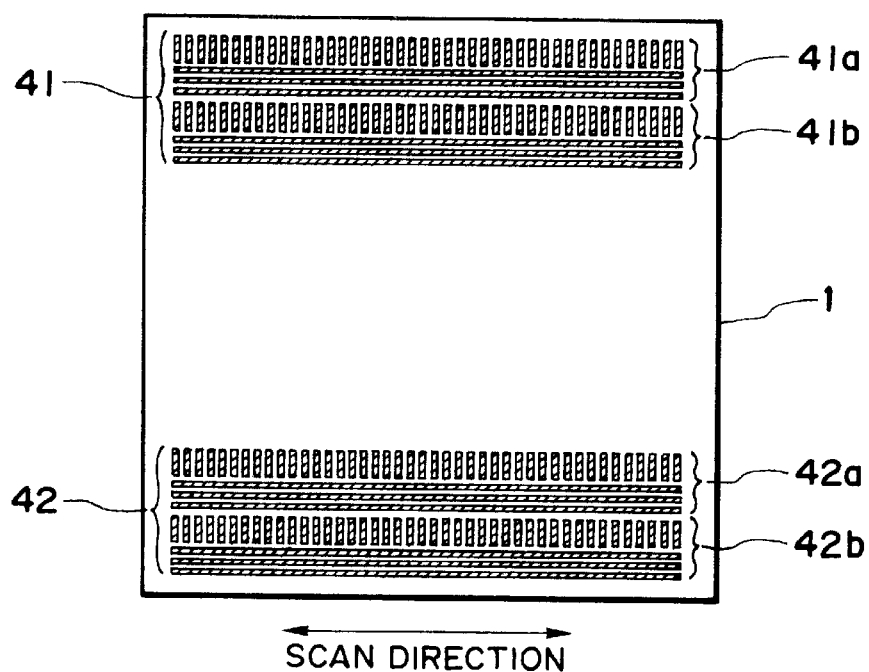

Referring to FIGS. 10 and 11B, a third embodiment of the present invention will be described.

In the preceding embodiments, the mask stage 3 is scanned plural times and the focus change amount is measured. However, in this embodiment, taking into account the throughput, focus shift calculation is executed only with a single scan.

Figure 14:
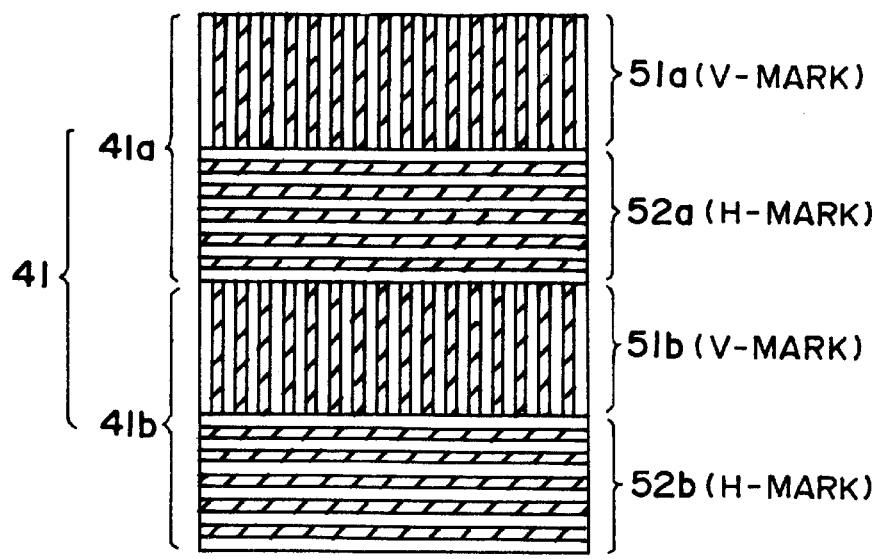
FIG. 14 is an enlarged view for explaining details of a detection mark usable in the third embodiment of the present invention.

In FIG. 10, light directed from an illumination system (not shown) goes through a focus detection system 4 and illuminates a pattern surface of a reticle 1 supported by a mask stage 3. On the pattern surface of the reticle 1, there are slits 41 and 42 such as shown in FIG. 11B or 14. Light passing through the slit (41a, 41b, 42a or 42b) goes through a projection optical system 2 and, after this, it impinges on a reflection surface 40a (40b) formed on a wafer stage 5.

Figure 13:
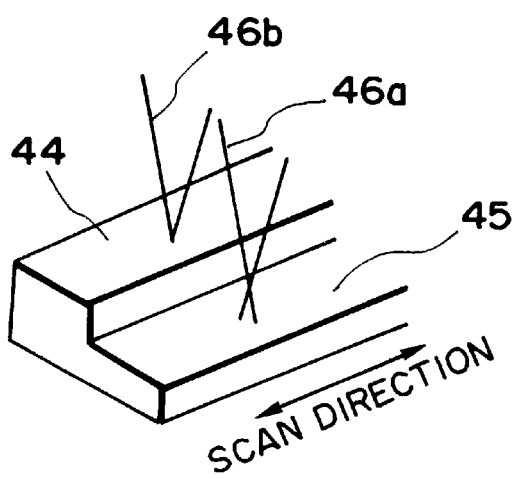
FIG. 13 is a fragmentary and schematic view, showing a reflection surface of a detection mark on a wafer stage, in the third embodiment of the present invention.

The reflection surface 40a comprises, as shown in FIG. 13, two reflection surfaces 44 and 45 having a surface level difference therebetween in the focus direction. Light 46a passing the slit 41a impinges on the reflection surface 45, and light 46b passing the slit 41b impinges on the reflection surface 44. The lights reflected by these reflection surfaces go again through the projection optical system 2 back to the focus detecting system 4. Behind the focus detecting system 4 and at a position where the reticle pattern surface is imaged (i.e., a position optically conjugate with the reticle pattern), there is a splitting mirror 43a for separating reflection light (detection light) of light rays 46a and 46b.

Figure 12:
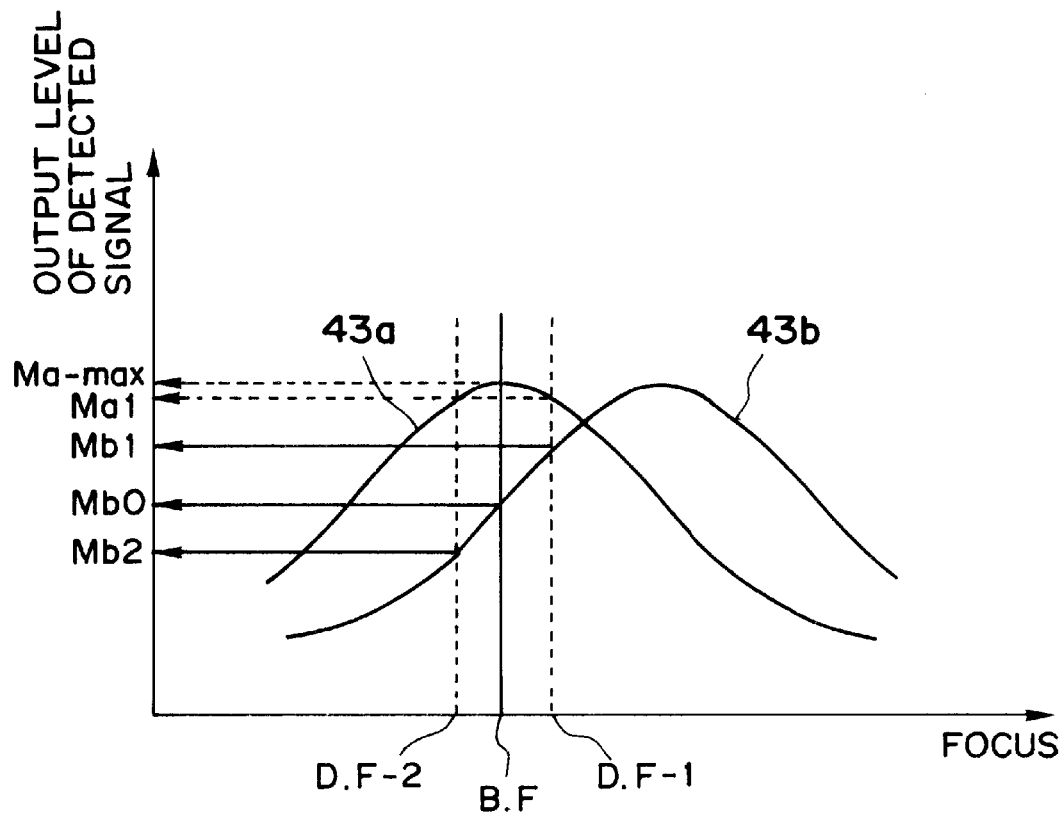
FIG. 12 is a graph showing detection signals obtainable in the third embodiment of the present invention.

By means of this splitting mirror 43a, detection light of light rays 46a is reflected in a direction denoted at 44a, and the quantity thereof is then detected by a photoelectric converting element (not shown). Similarly, detection light of light rays 46b is reflected in a direction denoted at 44b, and the quantity thereof is then detected by a photoelectric converting element (not shown). The light quantities detected in the directions 45a and 45b change with a focus shift of the wafer stage 5 and, as shown in FIG. 12, there are produced detection signals 43a and 43b having different peaks of focus, with a difference corresponding to the difference in level between the reflection surfaces 44 and 45.

Assume now that focus shift measurement in the scan operation starts as the reflection surface 44 is at the best focus plane. At that time, a signal intensity Ma-max is obtainable from a detected signal 43a, while a signal intensity Mbo is obtainable from a detected signal 43b. As the mask stage is subsequently scanned and focus shift measurement starts, if the focus changes to D.F-1, an intensity Ma1 is obtainable from the detected signal 43a. From this output value Ma1, an absolute value of defocus amount can be determined. Also, from the detected signal 43b, an intensity Mb1 is obtainable. From the detected signal 43a, an output value Ma1 similar to the one described above is obtainable, but if the focus changes to D.F-2 in a different defocus direction, a signal of intensity Mb2 is obtainable from the detected signal 43b. Thus, by monitoring the output value of the detection signal 43b, the direction of defocus can be detected.

When defocus change is to be detected also in the manner described above, a profile of a detection signal with respect to focus change may be detected beforehand. By subsequently executing focus change measurement during scan of the mask stage 3, high precision measurement is assured.

While some examples have been described with reference to slit 41 (FIG. 11B) on a reticle pattern, similar measurement may be made by using slit 42 which is provided on the opposite side of the reticle 41. By monitoring focus change at both sides of a reticle, it is possible to detect focus change (tilt component) in a direction perpendicular to the scan direction. Measured values may be controlled as offset and, during an actual exposure process, the exposure may be performed while moving the wafer stage 5 in the focus direction. High precision scan exposure is attainable.

Next, a fourth embodiment of the present invention will be described.

In the second and third embodiments, slit means provided on a reticle is used and it is illuminated. The focus shift is detected on the basis of the quantity of light coming back from a reflection surface of a wafer stage. In the present embodiment, as compared therewith, a detection mark (second slit mark) is formed on a wafer stage and, through observation of such mark, similar advantageous effects are provided.

Figure 20A:
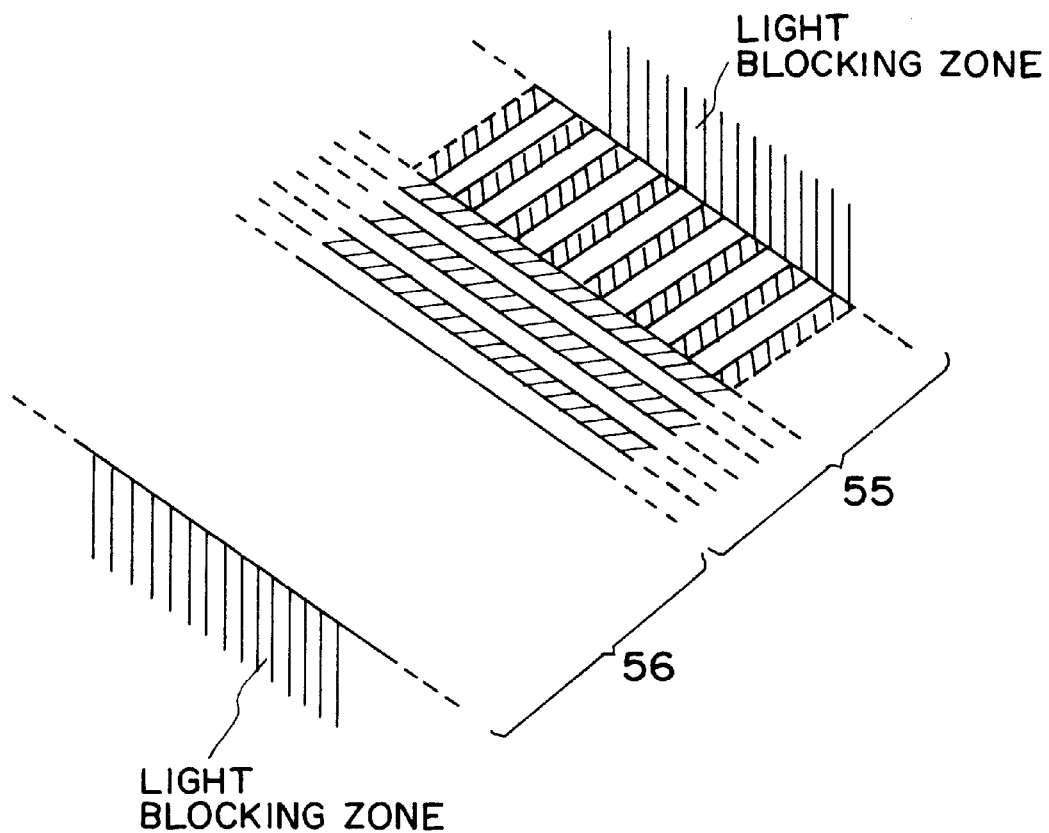
FIGS. 20A and 20B are enlarged views, respectively, for explaining a mark on a reticle and a mark on a wafer, usable in the fourth embodiment of the present invention.
Figure 20B:
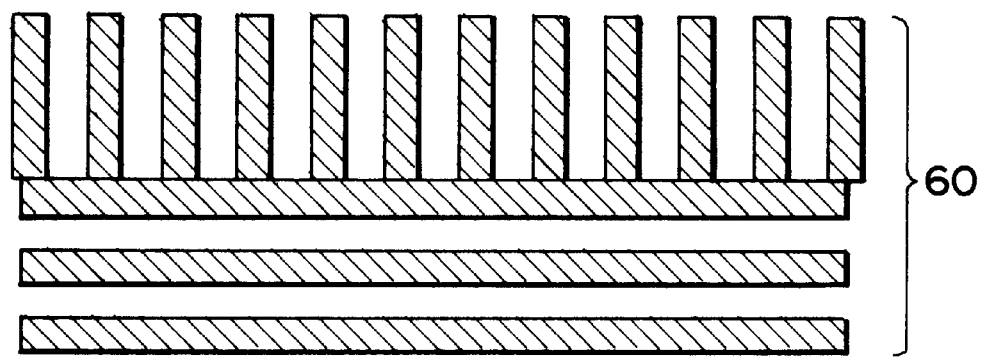

FIG. 20B illustrates a detection mark 60 according to this embodiment, which mark is formed on a wafer stage 5.

Figure 21:
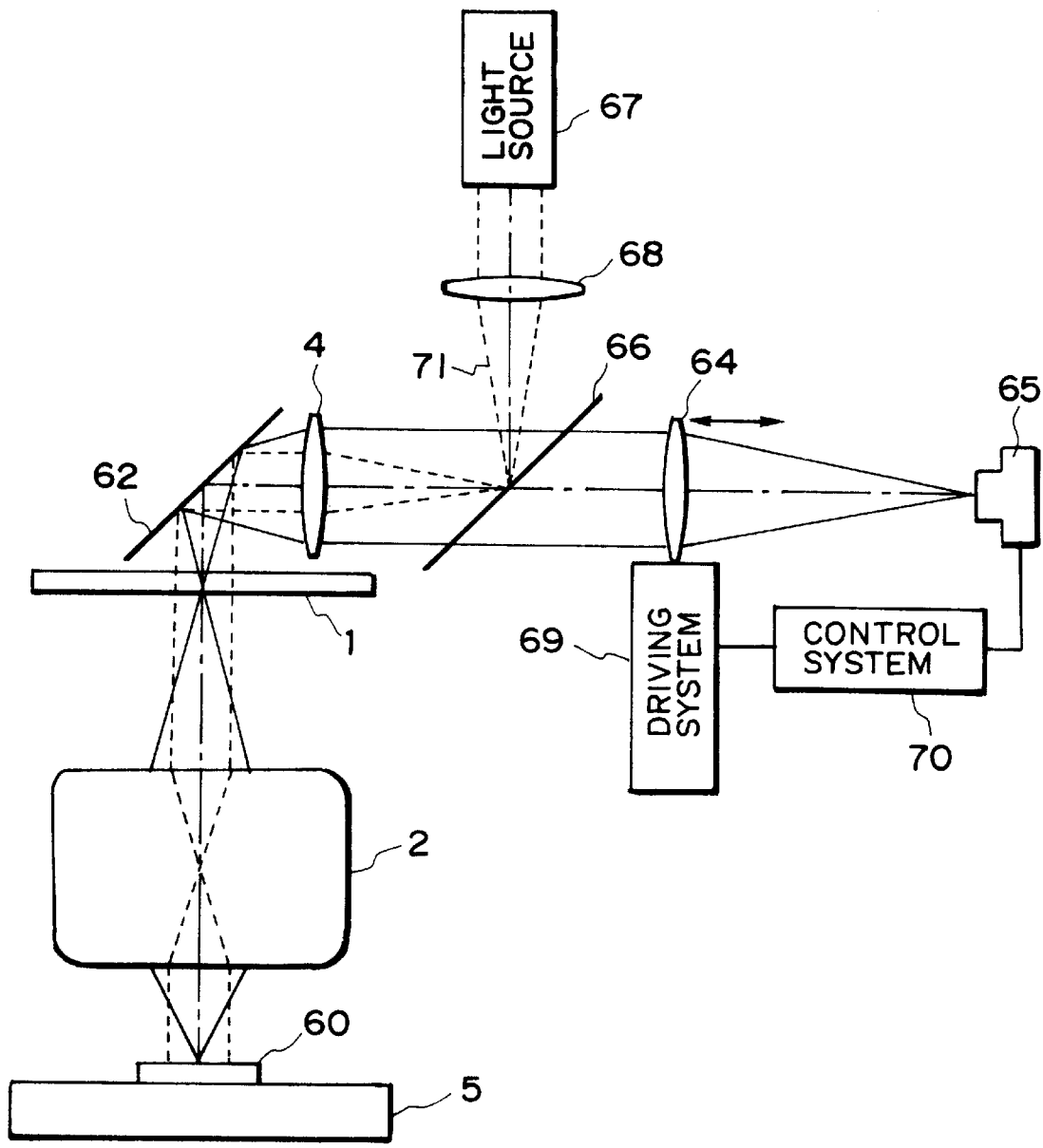
FIG. 21 is a schematic view of a scan type exposure apparatus according to the fourth embodiment of the present invention.

Referring to FIG. 21, the process of detecting the detection mark 60 in this embodiment will be explained.

In FIG. 21, light from an illumination light source 67 goes through an illumination optical system 68 and enters a beam splitter 66. Light reflected by the beam splitter 66 enters a detection optical system 4 and, after being reflected by a mirror 62, it illuminates the pattern surface of a reticle 1, perpendicularly (Koehler illumination). Here, in a region of the reticle 1 where no pattern is present, the illumination light passes the projection optical system 2 and impinges on the detection mark 60 provided on the wafer stage 5. Reflected or scattered light from the detection mark 60 goes again through the projection optical system 2 and, after passing the reticle 1, it is reflected by the mirror 62. The reflected light enters the detection optical system 63 and passes the beam splitter 66. The transmitted light goes through a detection optical system 64 and it forms an image of the detection mark 66 upon a photoelectric converting element 65. By moving the detection optical system 64 in the focus direction, the image of a mark on the reticle or an image of the detection mark 66 can be focused upon the photoelectric converting element 65.

As shown in FIG. 20A, on the reticle, there are a mark (hereinafter "reticle focus mark") 55 for focusing with respect to the reticle pattern, and a window (observation window) 56 for observation of the detection mark 60 of the wafer stage 5. The detection mark 60 of the wafer stage 5 comprises two slit marks such as illustrated in FIG. 20B. When the reticle 1 of such structure is observed through the detection system, if the focus direction of the wafer stage 5 with respect to the reticle pattern is correct and if the focus is adjusted, with the detection optical system, onto the photoelectric converting element 65, both of the images 60 and 55 to be observed there can be observed in in-focus. Namely, both of the pattern of the reticle 1 and the detection mark 60 of the wafer stage 5 can be observed at once. By adjusting the focus to the reticle pattern constantly, a defocus state of the wafer stage (reticle image) 5 can be detected.

Figure 22A:
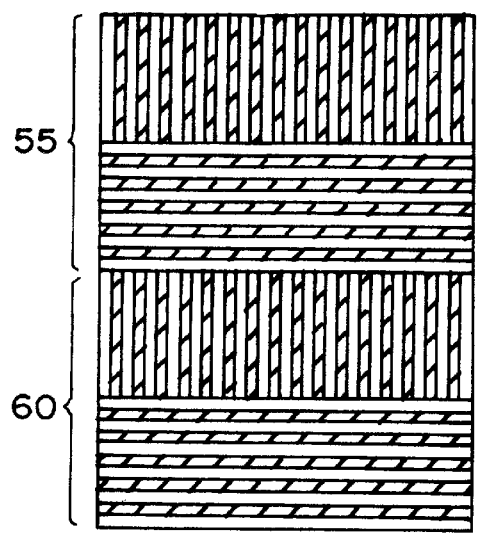
FIG. 22A is an enlarged view and FIGS. 22B and 22C are graphs, respectively, for explaining an image in simultaneous observation of a mask and a wafer in the fourth embodiment of the present invention as well as changes in a detection signal and contrast.

Now, the process of focus adjustment to the photoelectric converting element 65 through the detection optical system 64 for the reticle pattern will be explained. FIG. 22A shows a detection mark 60 and a reticle pattern 90 to be imaged on the photoelectric converting element 65. For observation of these marks during scan of the mask stage 3, the detection optical system 64 performs real-time drive so that the reticle pattern 55 is focused on the photoelectric converting element 65.

Here, the detection mark 60 is observed, and a defocus amount is calculated from the mark waveform. Practically, if there is a focus change with respect to the reticle pattern detecting system due to pitching of the mask stage 3, for example, the detection system has to be focus-adjusted continuously with respect to the reticle pattern, during the scan. To this end, the waveform of the focus mark 55 of the reticle 1 is observed and, through the control system 70, negative feedback is applied to the drive system 69 to move the detection optical system 64 into a best focus state thereof.

Figure 22B:
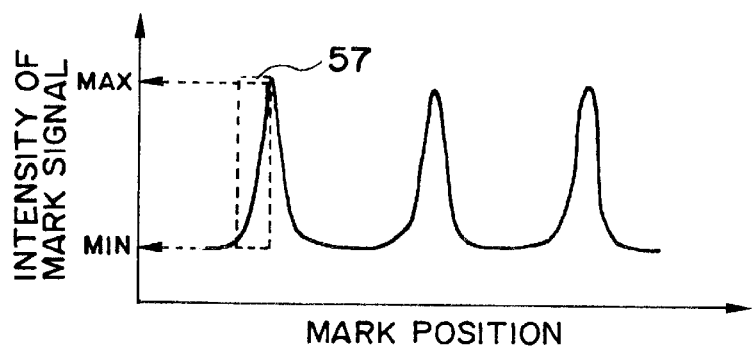
Figure 22C:
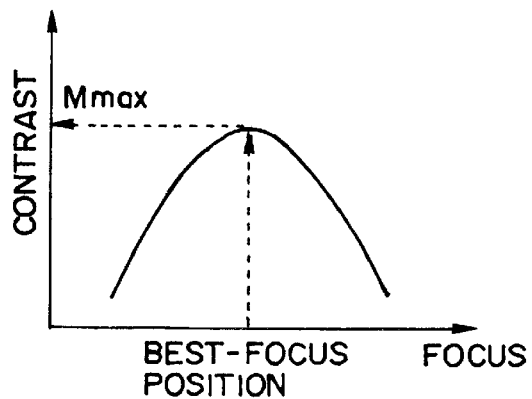
Figure 23:
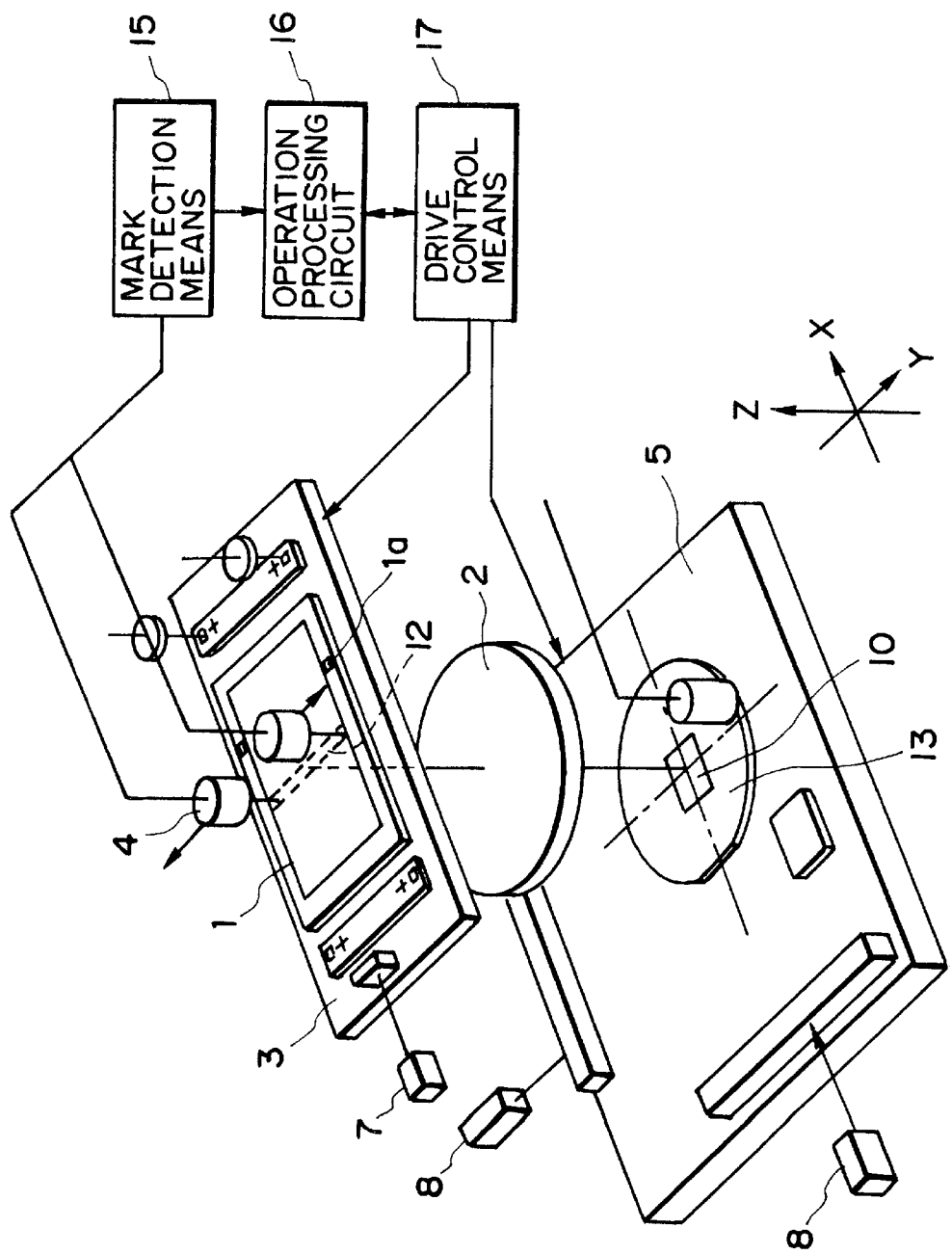
FIG. 23 is a schematic view of a main portion of a scan type exposure apparatus, for explaining problems to be solved by the present invention.

FIG. 22B is a schematic view, showing an example of a waveform of the detection mark 60. As regards evaluation of focus amount, contrast is calculated on the basis of a maximum level MAX and a minimum level MIN of the detected waveform. FIG. 22C shows a variation of contrast with defocus amount. It is seen that the contrast shows a peak with the best focus surface, and it slows down with defocus. Thus, it can be treated like that of FIG. 15A described with reference to the second embodiment. Since the focus shift can be detected in the same manner as that of the second embodiment, a description of it will be omitted here. While in this example the contrast is calculated and evaluated on the basis of the maximum level and minimum level of the waveform signal, the invention is not limited to this. For example, any tilt of an edge portion of the detected waveform (e.g., region 57 in FIG. 22B), that is, an absolute value of a differentiated value, may be evaluated.

Although the detection mark described comprises both of an H mark and a V mark, it is not always necessary to use both of them. If both of these marks are used, an intermediate value between the best focus plane of the H mark and the best focus plane of the V mark may preferably be taken as a best focus plane of the reticle image. As compared therewith, if the detection system or the projection optical system comprises an optical system with respect to which production of astigmatism can be disregarded, measurement may be made by using only one of the H mark and V mark, and a measured value obtained may be taken as a focus correction value.

A peak of a detection signal is determined as a best focus plane of an exposure image plane. Practically, however, it is possible that there is an offset in relation to the actual exposure image plane. On that occasion, the offset amount may be measured through an actual exposure process, and then focus change may be calculated while taking into account the offset. This enables high precision measurement, in accordance with an actual exposure process.

Next, an embodiment of a semiconductor device manufacturing method using a scan type projection exposure apparatus described above, will be explained.

Figure 24:
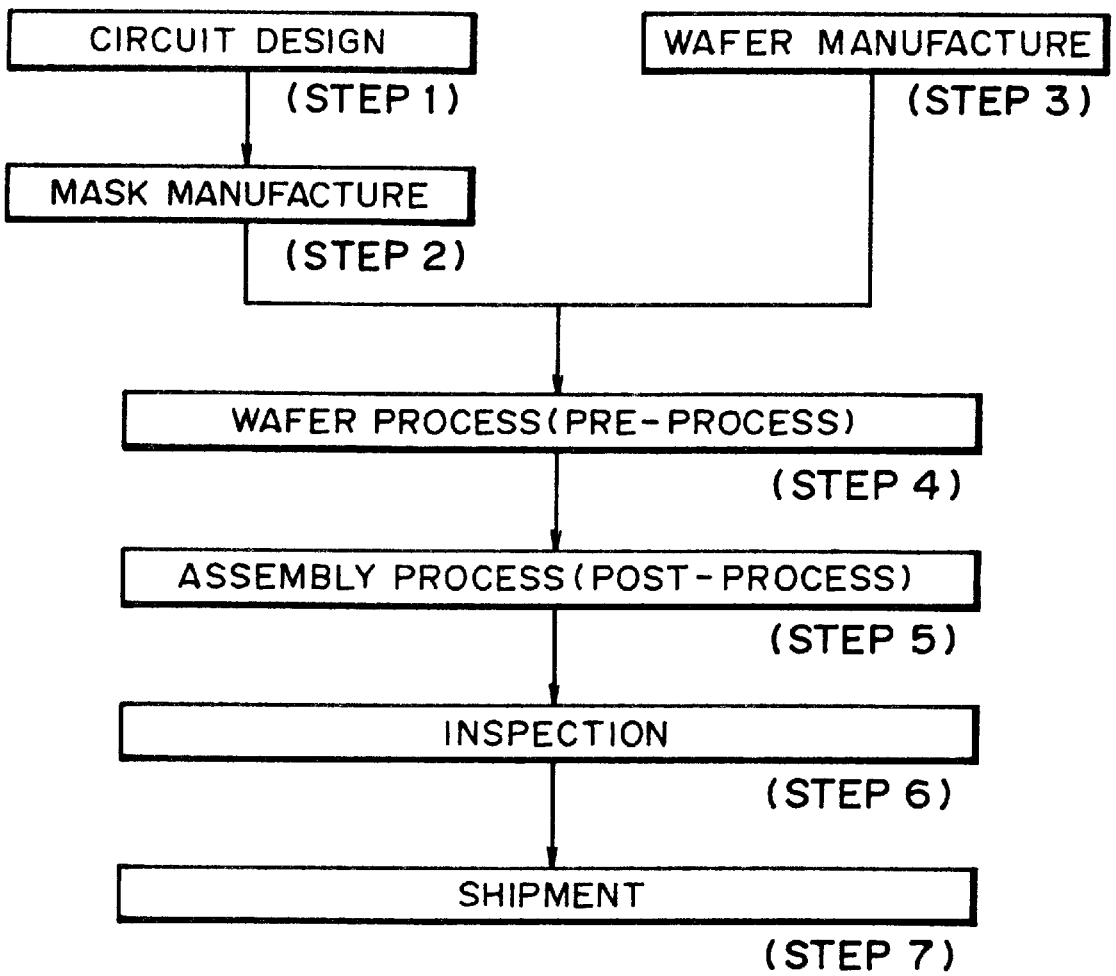
FIG. 24 is a flow chart for explaining device manufacturing processes according to an embodiment of the present invention.

FIG. 24 is a flow chart of a procedure for the manufacture of microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 25:
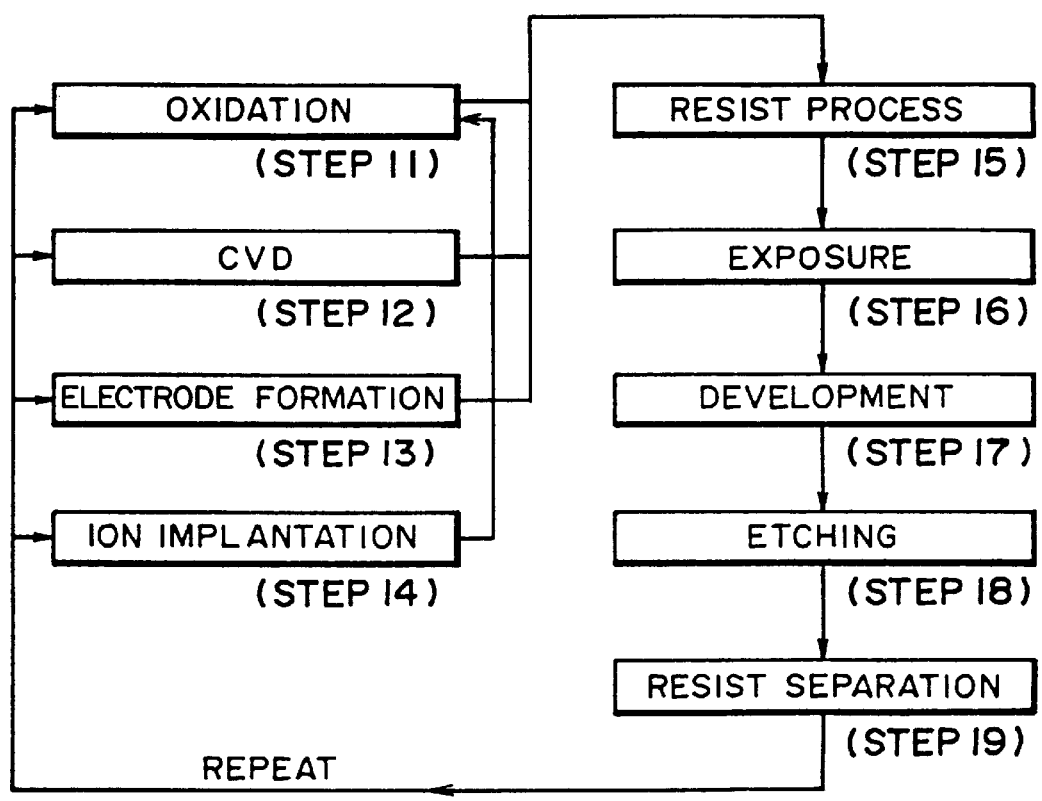
FIG. 25 is a flow chart of a wafer process.

FIG. 25 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with these embodiments of the present invention, in a scan type semiconductor exposure apparatus, a change in exposure condition resulting from deformation in a portion of the apparatus, due to drive of a first or second movable stage, is measured beforehand. During an actual exposure process, scan exposure is performed while reflecting a correction value with respect to a measured change in exposure condition. This avoids the effect of vibration, resulting from stage drive, without a decrease of throughput or without an increase of scan distance.

Since there is no increase in scan distance, it is not necessary to enlarge the size of the stage. It is, therefore, possible to avoid enlargement of space for the apparatus.

While the invention has been described with reference to the structures disclosed herein, it is not confined to the details set forth and this application is intended to cover such modifications or changes as may come within the purposes of the improvements or the scope of the following claims.

What is claimed is:

1. A scan type exposure apparatus, comprising:
    a first movable stage on which a first object is to be placed;
    a second movable stage on which a second object is to be placed;
    a projection optical system for projecting a pattern of the first object onto the second object;
    a scanning mechanism for scanningly moving said first and second movable stages in a timed relation with each other, relative to said projection optical system, while the pattern of the first object is projected by said projection optical system onto the second object;
    storing means for storing therein data corresponding to a change in an exposure condition, wherein the change in the exposure condition is a periodic change produced in response to a scan motion of at least one of the first and second stages and in accordance with a scan acceleration or a scan speed, and the data is measured beforehand by observing a projected image of a pattern of the first object, being formed on the second object through a projection optical system and by use of exposure light, while scanningly moving at least one of the first and second stages; and
    control means for controlling drive of said first and second movable stages in an actual exposure process, while reflecting a correction value, as determined on the basis of the data stored, to the drive of at least one of said first and second movable stages, wherein the correction value is determined with respect to plural accelerations or speeds of at least one of said first and second movable stages, and the correction value is set variably in accordance with the accelerations or speeds and with directions of the accelerations or speeds.

2. An apparatus according to claim 1, wherein the correction value is determined with respect to a deviation of a projected image of the pattern of the first object, upon the second object.

3. An apparatus according to claim 1, wherein the correction value is determined with respect to a focus error of a projected image of the pattern of the first object, upon the second object.

4. An apparatus according to claim 2, wherein the scan exposure is performed while controlling a quantity of exposure light in accordance with a speed of at least one of said first and second movable stages.

5. A scanning exposure method wherein, in an exposure apparatus, a first movable stage on which a first object is placed and a second movable stage on which a second object is placed are scanningly moved in a timed relation with each other, relative to a projection optical system, while a pattern of the first object is projected through the projection optical system onto the second object, said method comprising the steps of:
    storing data corresponding to a change in an exposure condition attributable to the exposure apparatus, wherein the change in the exposure condition is a periodic change produced in response to a scan motion of at least one of the first and second stages and in accordance with a scan acceleration or a scan speed, and the data is measured beforehand by observing a projected image of a pattern of the first object, being formed on the second object through a projection optical system and by use of exposure light, while scanningly moving at least one of the first and second stages; and
    performing scan exposure while reflecting a correction value, as determined on the basis of the data stored, to the drive of at least one of the first and second movable stages, wherein the correction value is determined with respect to plural accelerations or speeds of the first and second movable stages, and the correction value is set variably in accordance with the accelerations or speeds and with directions of the accelerations or speeds.

6. A device manufacturing method wherein, in an exposure apparatus, a first movable stage on which a first object is placed and a second movable stage on which a semiconductor wafer is placed are scanningly moved in a timed relation with each other, relative to a projection optical system, while a pattern of the first object is projected through the projection optical system onto the wafer, said method comprising the steps of:

storing data corresponding to a change in an exposure condition attributable to the exposure apparatus, wherein the change in the exposure condition is a periodic change produced in response to a scan motion of at least one of the first and second stages and in accordance with a scan acceleration or a scan speed, and the data is measured beforehand by observing a projected image of a pattern of the first object, being formed on the second object through a projection optical system and by use of exposure light, while scanningly moving at least one of the first and second stages; and performing scan exposure while reflecting a correction value, as determined on the basis of the data stored, to the drive of at least one of the first and second movable stages, wherein the correction value is determined with respect to plural accelerations or speeds of the first and second movable stages, and the correction value is set variably in accordance with the accelerations or speeds and with directions of the accelerations or speeds.

7. A method according to claim 6, wherein the correction value is determined with respect to deviation of a projected image of the pattern of the first object, upon the second object.

8. A method according to claim 6, wherein the correction value is determined with respect to a focus error of a projected image of the pattern of the first object, upon the second object.

9. A method according to claim 7, wherein the scan exposure is performed while controlling a quantity of exposure light in accordance with a speed of at least one of the first and second movable stages.

10. A scan type projection exposure apparatus, comprising:

a first movable stage on which a first object is to be placed;

a second movable stage on which a second object is to be placed;

a projection optical system;

scanning means cooperable with said projection optical system, for scanningly moving said first and second movable stages in a timed relation with each other and at a speed ratio corresponding to a projection magnification of said projection optical system so that a pattern of the first object is projected by said projection optical system onto the second object;

detecting means for measuring a position of an image plane of the first object defined by said projection optical system;

storing means for storing therein data corresponding to a change in an exposure condition, wherein the change in the exposure condition is a periodic change produced in response to a scan motion of at least one of the first and second stages and in accordance with a scan acceleration or a scan speed, and the data is measured beforehand by observing a projected image of a pattern of the first object, being formed on the second object through a projection optical system and by use of exposure light, while scanningly moving at least one of the first and second stages; and driving means for moving the second object in a direction of focus on the basis of the correction values, to set the second object with respect to the image plane position.

11. An apparatus according to claim 10, wherein, before image plane position measurement during scanning motion of said first movable stage, said detecting means detects image plane position information of the first object defined by said projection optical system as said first movable stage is held fixed, on the basis of which image plane position information said detecting means calculates information related to image plane positions with respect to different scan positions of said first movable stage.

12. An apparatus according to claim 10, wherein said detecting means includes an illumination light source for projecting illumination light onto the first object, a first slit for passing a portion of the illumination light and provided to the surface of the first object, and light receiving means for detecting light, of the illumination light, passed through said first slit and through said projection optical system, and wherein said detecting means detects information related to image plane positions of the first object with respect to different scan positions of said first movable stage, as defined by said projection optical system, on the basis of a signal produced by said light receiving means.

13. An apparatus according to claim 10, wherein said detecting means includes an illumination light source for illuminating a slit mark provided on said second movable stage, and light receiving means for detecting light coming from said second slit mark and through said projection optical system, and wherein said detecting means detects information related to image plane positions of the first object with respect to different scan positions of said first movable stage, as defined by said projection optical system, on the basis of a signal produced by said light receiving means.

14. An apparatus according to claim 12, wherein said light receiving means detects light passed through said first slit and through said projection optical system and then reflected by a reflection surface, provided on said second movable stage and having a surface step structure, and then again passed through said projection optical system and through said first slit.

15. An apparatus according to claim 10, wherein the first object is formed with a first pattern for image plane position measurement and an observation window for observation of a surface of said second movable stage, said second movable stage is formed with a second pattern for image plane position measurement, said detecting means includes an observation system for simultaneous observation of said first and second patterns, such that said detecting means detects information related to image plane positions of the first object with respect to different scan positions of said first movable stage, as defined by said projection optical system, on the basis of said first and second patterns observed by said observation system.

16. A device manufacturing method, including aligning a reticle and a wafer and then projecting and printing a pattern of the reticle onto the wafer by using a scan type projection exposure apparatus as recited in any one of claims 10–15, and then developing the exposed wafer.

17. A scan type exposure apparatus comprising:

a first movable stage on which a first object is to be placed;

a second movable stage on which a second object is to be placed;

a projection optical system for projecting a pattern of the first object onto the second object;

a scanning mechanism for scanningly moving said first and second movable stages in a timed relation with each other, relative to said projection optical system, while the pattern of the first object is projected by said projection optical system onto the second object;

storing means for storing therein data corresponding to a change in an exposure condition attributable to said exposure apparatus, wherein the change in the exposure condition is a periodic change produced in response to a scan motion of at least one of the first and second stages and in accordance with a scan acceleration or a scan speed, and the data is measured beforehand by observing a projected image of a pattern of the first object, being formed on the second object through a projection optical system and by use of exposure light, while scanningly moving at least one of the first and second stages; and control means for controlling drive of said first and second movable stages in an actual exposure process, while reflecting a correction value, as determined on the basis of the data stored, to the driving of at least one of said first and second movable stages.

18. An apparatus according to claim 17, wherein the correction value is determined with respect to plural accelerations or speeds of at least one of said first and second movable stages, and the correction value is set variably in accordance with the accelerations or speeds and with directions of them.

19. An apparatus according to claim 17, wherein the correction value is determined with respect to a deviation of a projected image of the pattern of the first object, upon the second object.

20. An apparatus according to claim 17, wherein the correction value is determined with respect to a focus error of a projected image of the pattern of the first object, upon the second object.

21. An apparatus according to claim 19, wherein the scan exposure is performed while controlling a quantity of exposure light in accordance with a speed of at least one of said first and second movable stages.

22. A scanning exposure method comprising:

placing a first object on a first movable stage;

placing a second object on a second movable stage;

projecting a pattern of the first object onto the second object using a projection optical system;

scanningly moving, using a scanning mechanism, the first and second movable stages in a timed relation with each other, relative to the projection optical system, while projecting the pattern of the first object by the projection optical system onto the second object;

storing in storing means data corresponding to a change in an exposure condition attributable to an exposure apparatus that includes the first and second movable stages, wherein the change in the exposure condition is a periodic change produced in response to a scan motion of at least one of the first and second stages and in accordance with a scan acceleration or a scan speed, and the data is measured beforehand by observing a projected image of a pattern of the first object, being formed on the second object through a projection optical system and by use of exposure light, while scanningly moving at least one of the first and second stages; and controlling drive of the first and second movable stages in an actual exposure process, while reflecting a correction value, as determined on the basis of the data stored, to the driving of at least one of the first and second movable stages.

23. A device manufacturing method comprising:

placing a first object on a first movable stage;

placing a second object on a second movable stage;

projecting a pattern of the first object onto the second object using a projection optical system;

scanningly moving, using a scanning mechanism, the first and second movable stages in a timed relation with each other, relative to the projection optical system, while projecting the pattern of the first object by the projection optical system onto the second object;

storing in storing means data corresponding to a change in an exposure condition attributable to an exposure apparatus that includes the first and second movable stages, wherein the change in the exposure condition is a periodic change produced in response to a scan motion of at least one of the first and second stages and in accordance with a scan acceleration or a scan speed, and the data is measured beforehand by observing a projected image of a pattern of the first object, being formed on the second object through a projection optical system and by use of exposure light, while scanningly moving at least one of the first and second stages; and controlling drive of the first and second movable stages in an actual exposure process to manufacture a device, while reflecting a correction value, as determined on the basis of the data stored, to the driving of at least one of the first and second movable stages.

* * * * *

UNITED STATES PATENT AND TRADEMARK OFFICE
CERTIFICATE OF CORRECTION

PATENT NO. : 6,335,784 B2
DATED : January 1, 2002
INVENTOR(S) : Kazuhiko Mishima It is certified that error appears in the above-identified patent and that said Letters Patent is hereby corrected as shown below:

Column 12,
Lines 3, 40 and 49, "passing" should read -- passing through --.
Line 34, "passing" should read -- passing through -- and "passes" should read -- passing through --.

Signed and Sealed this

Sixteenth Day of July, 2002

Attest:

Attesting Officer

JAMES E. ROGAN
Director of the United States Patent and Trademark Office